US012334870B2

(12) United States Patent
 Fujimoto

(10) Patent No.: US 12,334,870 B2
(45) Date of Patent: Jun. 17, 2025

(54) OSCILLATOR AND DETECTING SYSTEM

(71) Applicant: CANON KABUSHIKI KAISHA, Tokyo (JP)

(72) Inventor: Kokichi Fujimoto, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 364 days.

(21) Appl. No.: 18/081,767

(22) Filed: Dec. 15, 2022

(65) Prior Publication Data
US 2023/0208037 A1 Jun. 29, 2023

(30) Foreign Application Priority Data
Dec. 24, 2021 (JP) ................. 2021-210623

(51) Int. Cl.
 *H03B 7/14* (2006.01)
 *G01S 13/88* (2006.01)
 *H03B 7/08* (2006.01)

(52) U.S. Cl.
 CPC ............ *H03B 7/146* (2013.01); *G01S 13/887* (2013.01); *H03B 7/08* (2013.01)

(58) Field of Classification Search
 CPC .. H03B 7/08; H03B 2200/0084; H03B 7/146; H03B 5/18; H01Q 23/00
 See application file for complete search history.

(56) References Cited

U.S. PATENT DOCUMENTS

| 7,012,475 | B2 | 3/2006 | Frazier |
| 7,492,230 | B2 | 2/2009 | Frazier |
| 7,907,024 | B2 | 3/2011 | Asada |
| 7,924,107 | B2 | 4/2011 | Koyama |
| 10,270,390 | B2 | 4/2019 | Suzuki |
| 11,437,956 | B2 | 9/2022 | Tanaka |
| 2005/0146386 | A1 | 7/2005 | Frazier |
| 2007/0057741 | A1 | 3/2007 | Frazier |
| 2009/0051452 | A1 | 2/2009 | Arada et al. |
| 2010/0026400 | A1 | 2/2010 | Koyama et al. |
| 2014/0266477 | A1* | 9/2014 | Sekiguchi ............... H01Q 1/38 331/96 |

(Continued)

FOREIGN PATENT DOCUMENTS

| JP | 2007-519236 A | 7/2007 |
| JP | 2009-049692 A | 3/2009 |

(Continued)

*Primary Examiner* — Ryan Johnson
(74) *Attorney, Agent, or Firm* — Venable LLP

(57) ABSTRACT

An oscillator includes a substrate, and a plurality of oscillation structures and a power feed structure. The power feed structure includes a power source and a bias supply unit, the oscillation structures each include one antenna and an N piece of a semiconductor element electrically connected to the antenna. The semiconductor elements exhibit negative resistance characteristics when driven by the power feed structure, and out of the N piece thereof, a P piece thereof are connected in parallel, and an S piece thereof are connected in series, an F piece thereof are supplied with bias in the forward direction, and an R piece thereof are supplied with bias in a reverse direction. The semiconductor element in one of the oscillation structures exhibits asymmetrical current-voltage properties between forward bias and reverse bias. At least one of the N, P, S, F, and R differs from another.

36 Claims, 26 Drawing Sheets

(56) References Cited

U.S. PATENT DOCUMENTS

| | | | |
|---|---|---|---|
| 2017/0155361 A1 | 6/2017 | Suzuki et al. | |
| 2021/0067094 A1* | 3/2021 | Kandori | H03B 5/129 |
| 2022/0006425 A1 | 1/2022 | Hiroyuki | |
| 2022/0173515 A1* | 6/2022 | Koyama | H03B 7/146 |
| 2022/0263466 A1 | 8/2022 | Fujimoto | |

FOREIGN PATENT DOCUMENTS

| | | |
|---|---|---|
| JP | 2009-152547 A | 7/2009 |
| JP | 2019-033464 A | 2/2019 |
| WO | 2015/170425 A1 | 11/2015 |
| WO | 2020/090782 A1 | 5/2020 |

* cited by examiner

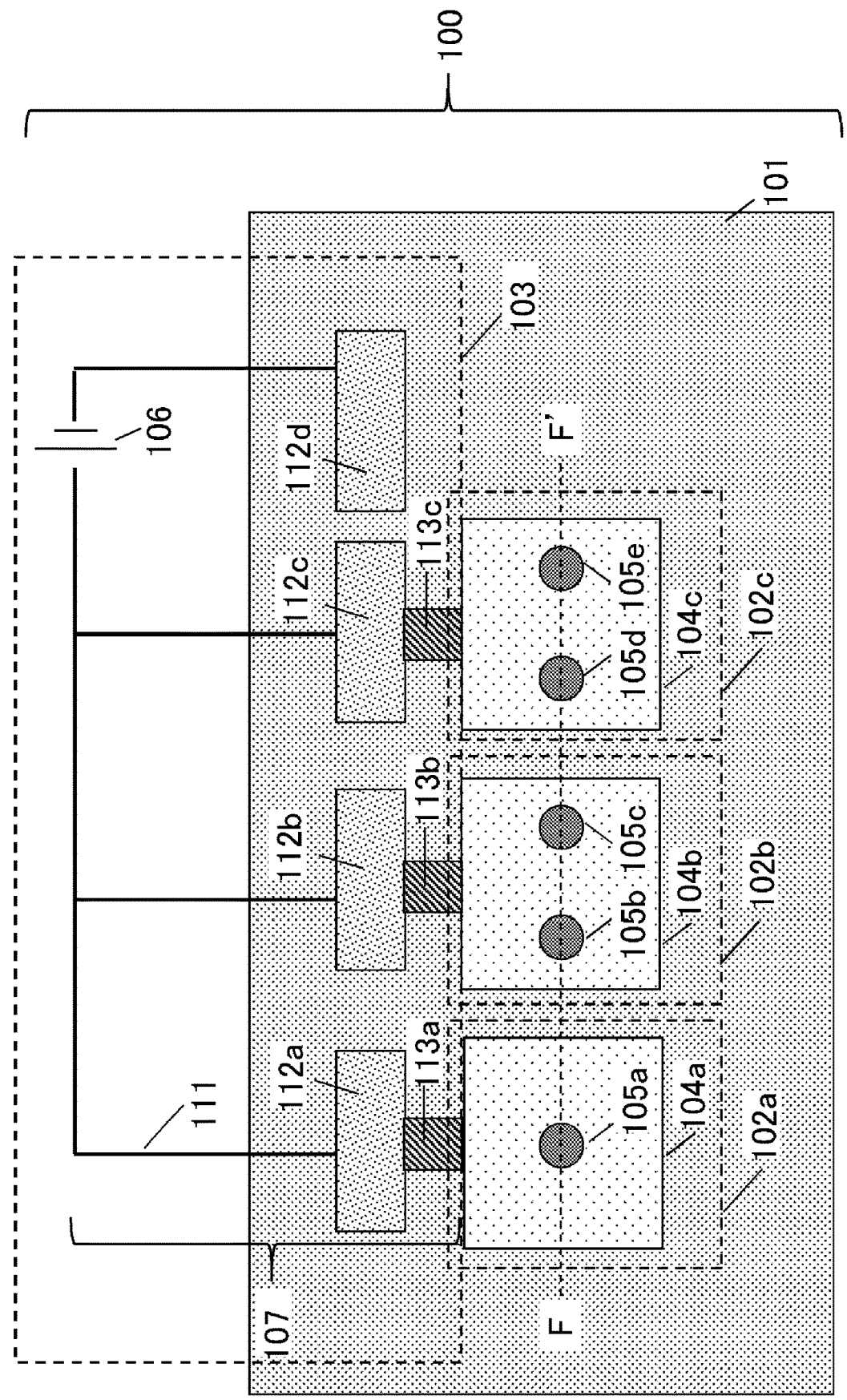

OSCILLATOR AND DETECTING SYSTEM

BACKGROUND OF THE INVENTION

Field of the Invention

Technology according to the present disclosure relates to an oscillator that has a negative resistance element and an antenna, and to a detecting system.

Description of the Related Art

Electromagnetic waves that have a frequency region of 30 GHz to 30 THz are referred to as terahertz waves. Absorbance peaks of a great many organic molecules in the fields of biomaterials, pharmaceuticals, electronic materials, and so forth, originating from structures and states, are present in the frequency region of terahertz waves. Terahertz waves also have a high degree of permeability through materials such as paper, ceramics, resin, and cloth. Research and development of imaging technology and sensing technology taking advantage of such features of terahertz waves is being performed in recent years.

As for such a terahertz-wave oscillator, a structure in which a negative resistance element such as a resonant tunneling diode (RTD) that has electromagnetic gain in the terahertz region, a Gunn diode, or the like, is integrated with an oscillator, is well known. In particular, there is expectancy for structures in which an RTD and an antenna are integrated as an oscillator to operate at a frequency region near 1 THz at room temperature.

However, greatly changing the oscillation frequency of such an oscillator is difficult in general, and in particular, finding a plurality of spectrums inside matter in order to identify the matter has necessitated performing oscillation at different oscillation frequencies using a plurality of oscillators. Accordingly, technology according to Japanese Patent Application Publication No. 2009-49692 and Japanese Patent Application No. 2016-517795 has been proposed.

The invention disclosed in Japanese Patent Application Publication No. 2009-49692 enables switching oscillation frequency with a single element, by making the thicknesses of thickness adjusting layers above and below a gain medium of the RTD to be asymmetrical as to each other, and also being equipped with a polarity switching mechanism for bias voltage. However, there is an issue in that only two frequencies at the most can be selected with a single element, and moreover the frequencies that can be selected are fixed, due to dependency on the original structure of the RTD.

Also, the invention disclosed in Japanese Patent Application No. 2016-517795 enables provision of a terahertz oscillator that is small in size and that is capable of continuous frequency variability at room temperature, by arraying, in parallel, varactor diodes of which the capacitance continuously changes by voltage sweeping. However, there are issues in that the addition of new parts, which are the varactor diodes, creates additional manufacturing processes, and in that output loss of the oscillator occurs in accordance with the varactor diodes.

SUMMARY OF THE INVENTION

With the foregoing in view, it is an object of the technology according to the present disclosure to provide an oscillator with a higher degree of freedom in selectable oscillation frequencies with a single oscillator, without addition of new parts.

According to an aspect of the present disclosure, it is provided an oscillator, including a substrate, a plurality of oscillation structures that transmit or receive electromagnetic waves, and are arranged on the substrate, and a power feed structure for electrically driving the plurality of oscillation structures, the power feed structure being arranged on the substrate, wherein the power feed structure includes a power source and a bias supply unit that supplies bias to the plurality of oscillation structures, the oscillation structures each include one antenna and an N piece (N≥1) of a semiconductor element electrically connected to the antenna, the semiconductor elements exhibit negative resistance characteristics when driven by the power feed structure, and out of the N piece thereof, a P piece (P≥0) thereof are connected to each other in parallel, and an S piece (S≥0) thereof are connected to each other in series, and with a direction of current flowing perpendicularly upward as to the substrate as a forward direction, an F piece (F≥0) thereof are supplied with bias in the forward direction, and an R piece (R≥0) thereof are supplied with bias in a reverse direction, the semiconductor element included in at least one of the oscillation structures exhibits asymmetrical current-voltage properties as to each other between forward bias and reverse bias, and at least one of the N, P, S, F, and R differs from another among the oscillation structures that are different from one another.

According to an aspect of the present disclosure, it is provided an oscillator, including a substrate, a plurality of oscillation structures that transmit or receive electromagnetic waves, and are arranged on the substrate, and a power feed structure for electrically driving the plurality of oscillation structures, the power feed structure being arranged on the substrate, wherein the power feed structure includes a power source, a bias supply unit that supplies bias to the plurality of oscillation structures, and a control unit that controls the bias supply by the bias supply unit, the oscillation structures each include one antenna and an N piece (N≥1) of a semiconductor element electrically connected to the antenna, the N piece of semiconductor elements are supplied with bias by operations of the control unit and exhibit negative resistance characteristics, and out of the N piece thereof, a P piece (P≥0) thereof are supplied with bias by operations of the control unit and are connected to each other in parallel, and an S piece (S≥0) thereof are supplied with bias by operations of the control unit and are connected to each other in series, and with a direction of current flowing perpendicularly upward as to the substrate as a forward direction, an F piece (F≥0) thereof are supplied with bias in the forward direction by operations of the control unit, and an R piece (R≥0) thereof are supplied with bias in a reverse direction by operations of the control unit, the semiconductor element included in at least one of the oscillation structures exhibits asymmetrical current-voltage properties as to each other between forward bias and reverse bias, and at least one of the N, P, S, F, and R differs from another among the oscillation structures that are different from one another, by operations of the control unit.

According to an aspect of the present disclosure, it is provided an oscillator, including a substrate, one oscillation structure that transmits or receives electromagnetic waves, and is arranged on the substrate, and a power feed structure for electrically driving the oscillation structure, the power feed structure being arranged on the substrate, wherein the power feed structure includes a power source, a bias supply unit that supplies bias to the oscillation structure, and a control unit that controls the bias supply by the bias supply unit, the oscillation structure includes one antenna and an N piece (N≥2) of a semiconductor element electrically connected to the antenna, the N piece of semiconductor elements are supplied with bias by operations of the control unit and exhibit negative resistance characteristics, and out of the N piece thereof, a P piece (P≥0) thereof are supplied with bias by operations of the control unit and are connected to each other in parallel, and an S piece (S≥0) thereof are supplied with bias by operations of the control unit and are connected to each other in series, and with a direction of current flowing perpendicularly upward as to the substrate as a forward direction, an F piece (F≥0) thereof are supplied with bias in the forward direction by operations of the control unit, and an R piece (R≥0) thereof are supplied with bias in a reverse direction by operations of the control unit, the semiconductor elements exhibit asymmetrical current-voltage properties as to each other between forward bias and reverse bias, and at least one of the N, P, S, F, and R changes, by operations of the control unit.

According to an aspect of the present disclosure, it is provided a detecting system, including the oscillator as described above, a reception element that receives radio frequency waves from the oscillator, and a processing circuit that processes signals from the reception element.

Further features of the present invention will become apparent from the following description of exemplary embodiments with reference to the attached drawings.

BRIEF DESCRIPTION OF THE DRAWINGS

FIG. 9 is a top view schematically illustrating an example of an oscillator according to Example 1;

DESCRIPTION OF THE EMBODIMENTS

A preferred embodiment of technology according to the present disclosure will be described below with reference to the Figures. Note that the Figures are only included in order to describe structures and configurations, and that the members which are illustrated are not necessarily to scale. Also, members that are the same and components that are the same in the Figures are denoted by the same reference signs, and repetitive description will be omitted hereinafter. In the description, the term "A or B," "at least one of A or/and B," or "one or more of A or/and B" may include all possible combinations of the items that are enumerated together. For example, the term "A or B" or "at least one of A or/and B" may designate (1) at least one A, (2) at least one B, or (3) both at least one A and at least one B.

Embodiment

Figure 1:
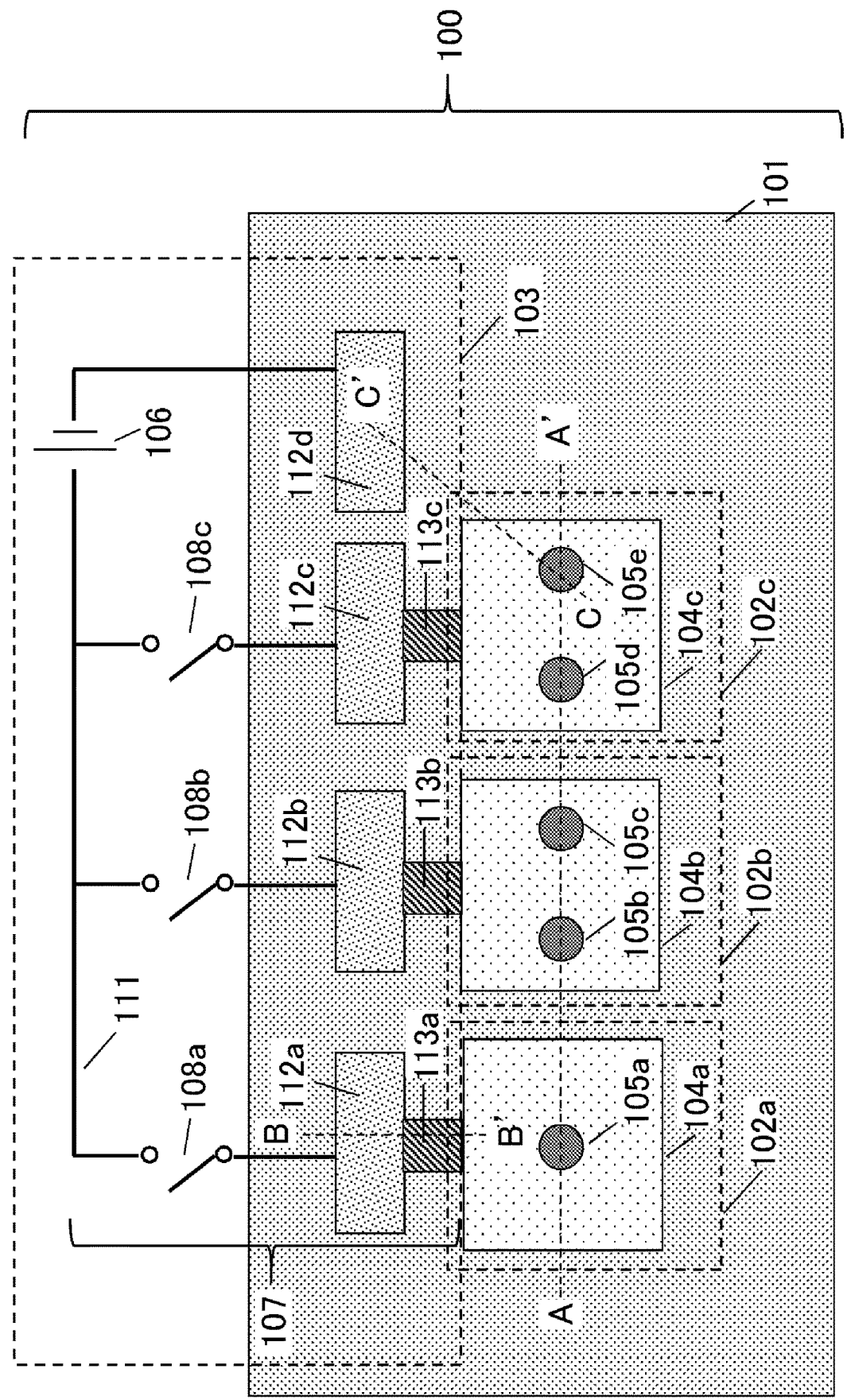
FIG. 1 is a top view schematically illustrating an example of an oscillator according to an embodiment.
Figure 2:
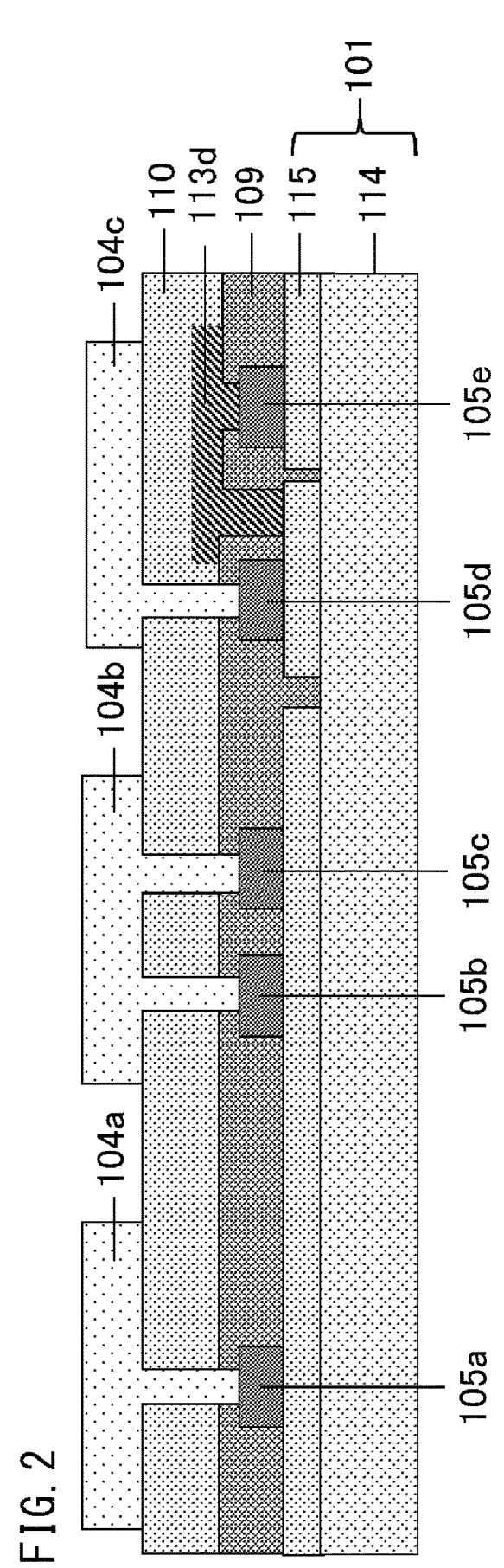
FIG. 2 is a cross-sectional view taken along line A-A' in FIG. 1, a cross-sectional view taken along line F-F' in FIG. 9, and a cross-sectional view taken along line G-G' in FIG. 10.
Figure 3:
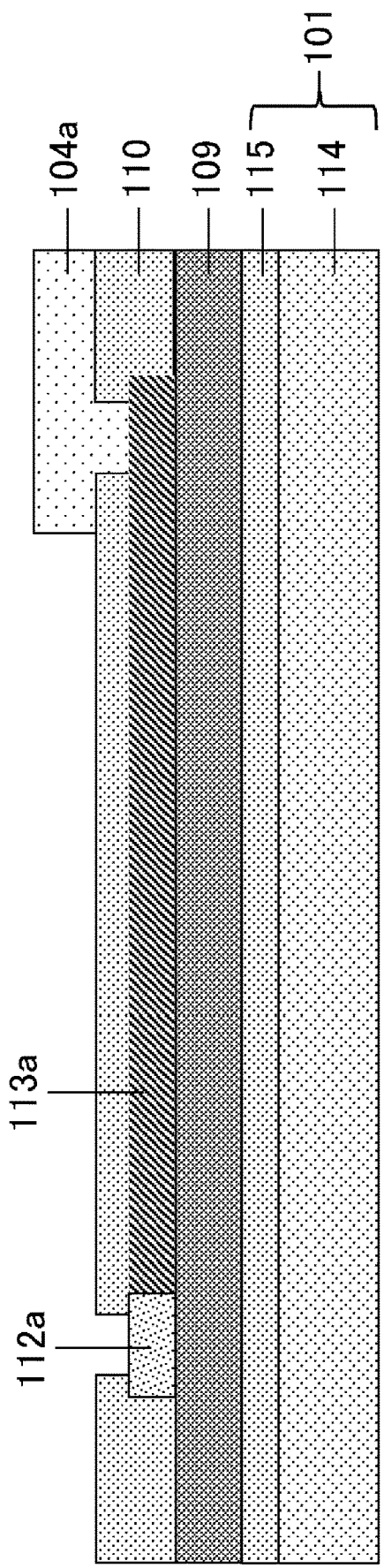
FIG. 3 is a cross-sectional view taken along line B-B' in FIG. 1.
Figure 4:
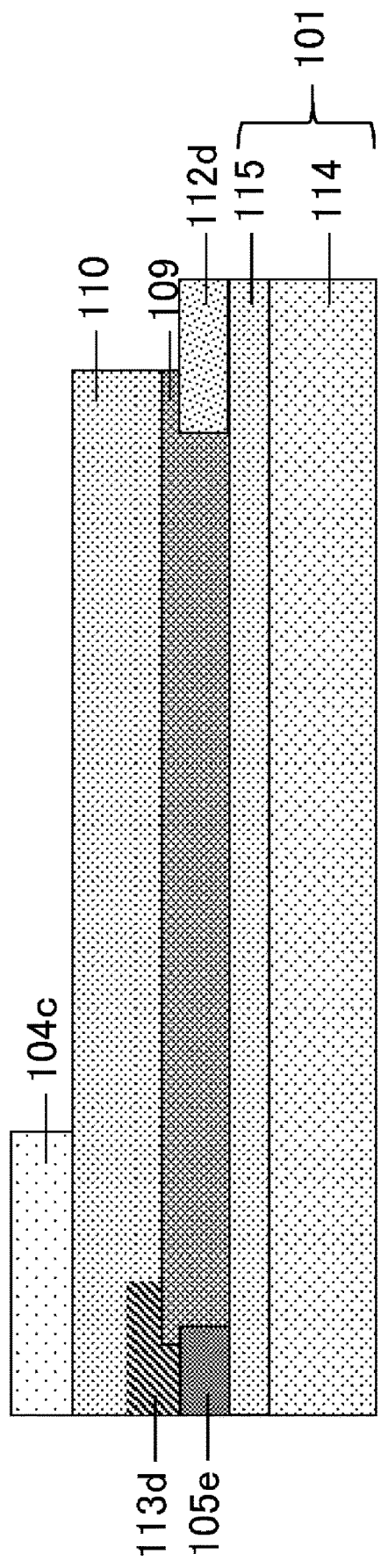
FIG. 4 is a cross-sectional view taken along line C-C' in FIG. 1.
Figure 5:
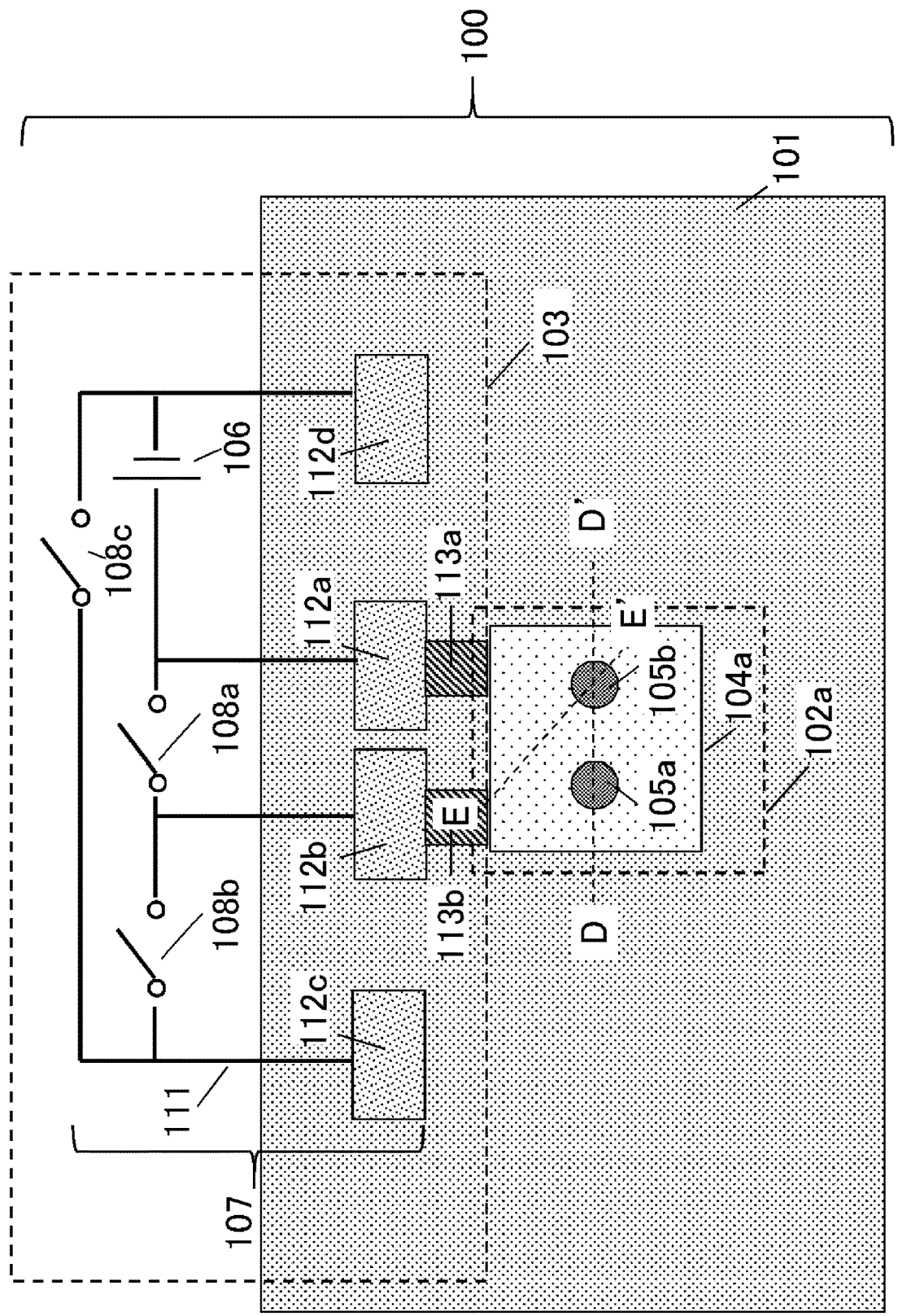
FIG. 5 is a top view schematically illustrating an example of the oscillator according to the embodiment, and a top view schematically illustrating an example of the oscillator according to Example 4.
Figure 6:
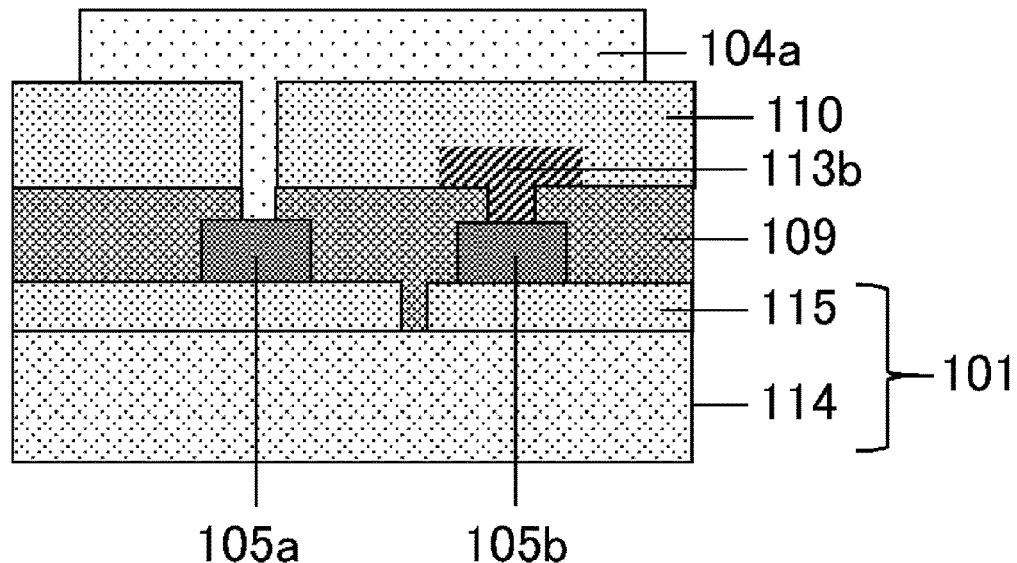
FIG. 6 is a cross-sectional view taken along line D-D' in FIG. 5.
Figure 7:
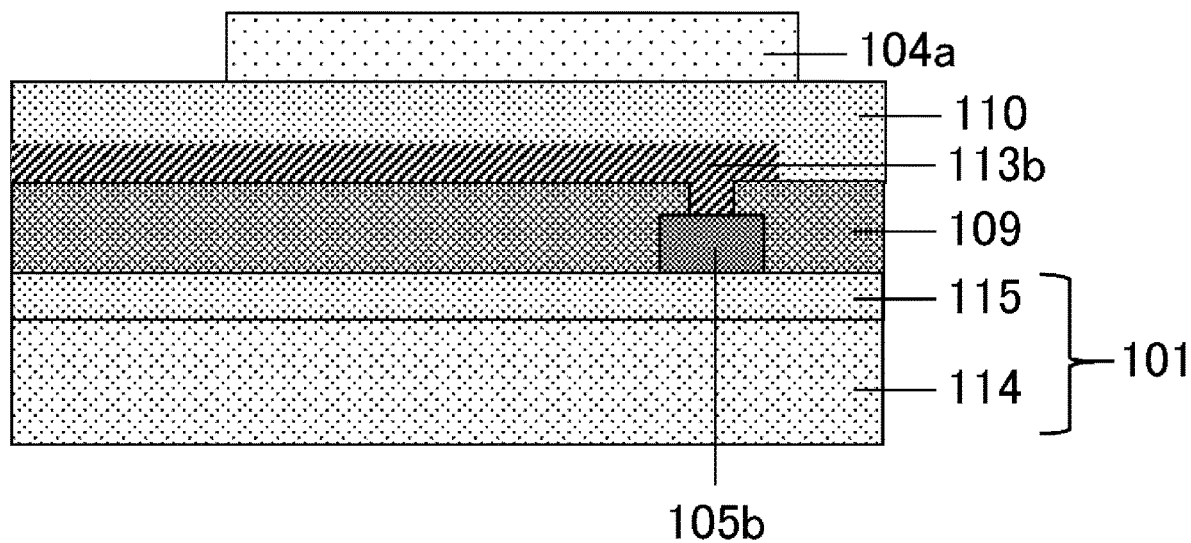
FIG. 7 is a cross-sectional view taken along line E-E' in FIG. 5.

An oscillator according to an embodiment will be described with reference to FIGS. 1 to 7. FIGS. 1 and 5 are top views of the oscillator, FIG. 2 is a cross-sectional view taken along line A-A' in FIG. 1, FIG. 3 is a cross-sectional view taken along line B-B' in FIG. 1, FIG. 4 is a cross-sectional view taken along line C-C' in FIG. 1, FIG. 6 is a cross-sectional view taken along line D-D' in FIG. 5, and FIG. 7 is a cross-sectional view taken along line E-E' in FIG. 5. Matters that are in common in the present embodiment and all Examples below will be described. Firstly, as illustrated in FIG. 3, a pad 112a and a conductor 113a are connected, and the conductor 113a and an antenna 104a are connected. Note that this is the same regarding the connection relations of each of pads 112b and 112c, conductors 113b and 113c, and antennas 104b and 104c. Secondly, a pad 112d that is not connected to a conductor 113d is connected to a substrate low-resistance layer 115, as illustrated in FIG.

4. Thirdly, semiconductor elements 105a to 105e serving as negative resistance elements are resonant tunneling diodes, and the antennas 104a to 104c are patch antennas. The above is matters that are in common in the present embodiment and all Examples below. These matters hold in the present embodiment and all Examples below unless specifically stated otherwise, and description thereof may be omitted.

The oscillator 100 according to the present embodiment, illustrated in FIGS. 1 to 4, has a substrate 101, oscillation structures 102a to 102c for transmitting or receiving electromagnetic waves, and a power feed structure 103. In the present embodiment, electromagnetic waves include a frequency component of 30 GHz to 30 THz. As illustrated in FIG. 2, the oscillation structure 102a has the antenna 104a and the semiconductor element 105a, and the antenna 104a and the semiconductor element 105a are electrically connected to each other. The oscillation structure 102b has the antenna 104b, the semiconductor element 105b, and the semiconductor element 105c. The antenna 104b, the semiconductor element 105b, and the semiconductor element 105c are electrically connected to each other, and the semiconductor element 105b and the semiconductor element 105c are electrically connected to each other in parallel via the antenna 104b. The oscillation structure 102c has the antenna 104c, the semiconductor element 105d, and the semiconductor element 105e. The antenna 104c, the semiconductor element 105d, and the semiconductor element 105e are electrically connected to each other, and the semiconductor element 105d and the semiconductor element 105e are electrically connected to each other in series via the conductor 113d.

The power feed structure 103 has a power source 106, a bias supply unit 107, and control units 108a to 108c. The bias supply unit 107 has wiring 111 including wire bonding, the pads 112a to 112d, and the conductors 113a to 113c. The pad 112a and the conductor 113a are electrically connected to the antenna 104a as illustrated in FIG. 3, and the pad 112d and the substrate low-resistance layer 115 are electrically connected as illustrated in FIG. 4. Note however, the portion of the substrate low-resistance layer 115 connected to the semiconductor element 105d is not connected to any of the pads 112a to 112d. Turning only the control unit 108a to on, and the control units 108b and 108c to off, enables just the oscillation structure 102a to be driven. Similar operations enable the oscillation structure 102b alone or the oscillation structure 102c alone to be driven, and also a plurality of oscillation structures can be driven simultaneously.

Also, the oscillator 100 according to the present embodiment, illustrated in FIGS. 5 to 7, has the substrate 101, the oscillation structures 102a for transmitting or receiving electromagnetic waves, and the power feed structure 103. As illustrated in FIG. 6, the oscillation structure 102a has the antenna 104a, the semiconductor element 105a, and the semiconductor element 105b, and the antenna 104a and the semiconductor element 105a are electrically connected to each other. The power feed structure 103 has the power source 106, the bias supply unit 107, and the control units 108a to 108c. The bias supply unit 107 has the wiring 111 including wire bonding, the pads 112a to 112d, and the conductors 113a and 113b. The pad 112b and the conductor 113b are electrically connected, and the conductor 113b is electrically connected to the semiconductor element 105b as illustrated in FIG. 7. The pad 112c and the pad 112d are electrically connected to the substrate low-resistance layer 115, and the pad 112c is electrically connected to the semiconductor element 105a via the substrate low-resistance layer 115. The pad 112d is electrically connected to the semiconductor element 105b and a first insulator 109 via the substrate low-resistance layer 115.

In the oscillator 100 illustrated in FIGS. 5 to 7, turning the control unit 108a to off, the control unit 108b to off, and the control unit 108c to on, electrically insulates the semiconductor element 105b. Thus, part of the bias supply unit is insulated by operations of the control units in the power feed structure. Also, by turning the control unit 108a to on, the control unit 108b to off, and the control unit 108c to on, the semiconductor element 105a and the semiconductor element 105b are electrically connected in parallel with each other. By turning the control unit 108a to off, the control unit 108b to on, and the control unit 108c to off, the semiconductor element 105a and the semiconductor element 105b are electrically connected in series with each other.

As described above, the oscillator 100 according to the present embodiment is illustrated in FIG. 1 or 5, and the oscillator 100 illustrated in FIG. 1 does not necessarily need to have the control units 108a to 108c. Also, in the description of oscillators according to the Examples below, configurations that are the same as the above-described configurations are denoted by the same signs, and the above description will be omitted.

The principle of frequency variability of the oscillator 100 according to the present embodiment will be described. The oscillation frequency $f_0$ of an LC circuit is expressed by the following Expression (1), using capacitance $C_d$ of a negative resistance element, capacitance $C_a$ of an antenna, and inductance $L_a$ of the antenna. Note that the capacitance $C_a$ of the antenna is determined by the permittivity, area, and thickness of an insulator interposed between the antenna and the substrate.

$$f_0 = \frac{1}{\sqrt{2\pi(C_d + C_a)L_a}} \quad (1)$$

Accordingly, the oscillation frequency $f_0$ changes by changing at least the capacitance $C_d$. In the present embodiment, at least one of the "pieces" of the negative resistance elements making up the LC circuit, the "pieces of the negative resistance elements connected in parallel to each other", the "pieces of the negative resistance elements connected in series to each other", the "pieces of the negative resistance elements supplied with forward bias", and the "pieces of the negative resistance elements supplied with reverse bias", is intentionally changed.

First, the reason why the capacitance $C_d$ changes by change in the "pieces" of the negative resistance elements, the "pieces of the negative resistance elements connected in parallel to each other", and the "pieces of the negative resistance elements connected in series to each other", will be described. The reason is that in a case in which P piece(s) of the same negative resistance elements (capacitance $C_d$) are connected to each other in parallel, the capacitance is $PC_d$, and in a case in which S piece(s) of the same negative resistance elements (capacitance $C_d$) are connected to each other in series, the capacitance is $C_d/S$. Next, the reason why the capacitance $C_d$ changes by change in the "pieces of the negative resistance elements supplied with forward bias", and the "pieces of the negative resistance elements supplied with reverse bias", will be described. The capacitance $C_d$ has negative differential conductance (NDC) dependency, and the NDC has driving voltage dependency of negative resistance elements. Accordingly, when defining the direction for forward, if the current-voltage properties of the negative resistance elements are asymmetrical between when supplying forward bias and when supplying reverse bias, the NDC changes at the time of bias inversion, and the capacitance $C_d$ will change. Thus, out of N pirces of negative resistance elements making up the LC circuit, when F pieces of the negative resistance elements is supplied forward bias (capacitance $C_d\_F$) and R pieces of the negative resistance elements is supplied reverse bias (capacitance $C_d\_R$), the capacitance $C_d$ changes in accordance with change in F and R.

Next, conditions that the cross-sectional areas of the semiconductor elements should satisfy in the present embodiment, in a case such as in an equivalence circuit illustrated in FIG. 25, particularly in a case of being made up of $S_1$ piece(s) to $S_n$ piece(s) of semiconductor elements connected to each other in parallel, where the N pieces of the semiconductor elements is N≥2, will be described. As illustrated therein, $S_k$ piece(s) (k=1 to n) of semiconductor elements are each made up of a single semiconductor element or single semiconductor elements connected to each other in series, and exhibit negative resistance characteristics when driven by the power feed structure. Further, the $S_k$ piece(s) of semiconductor elements and $C_k$ piece(s) ($C_k \geq 0$) of semiconductor elements are connected to each other in series. The $C_k$ pieces of semiconductor elements are each made up of single semiconductor elements connected to each other in series in $C_k \geq 2$, and the $C_k$ pieces of semiconductor elements exhibit positive resistance characteristics when driven by the power feed structure.

Figure 25:
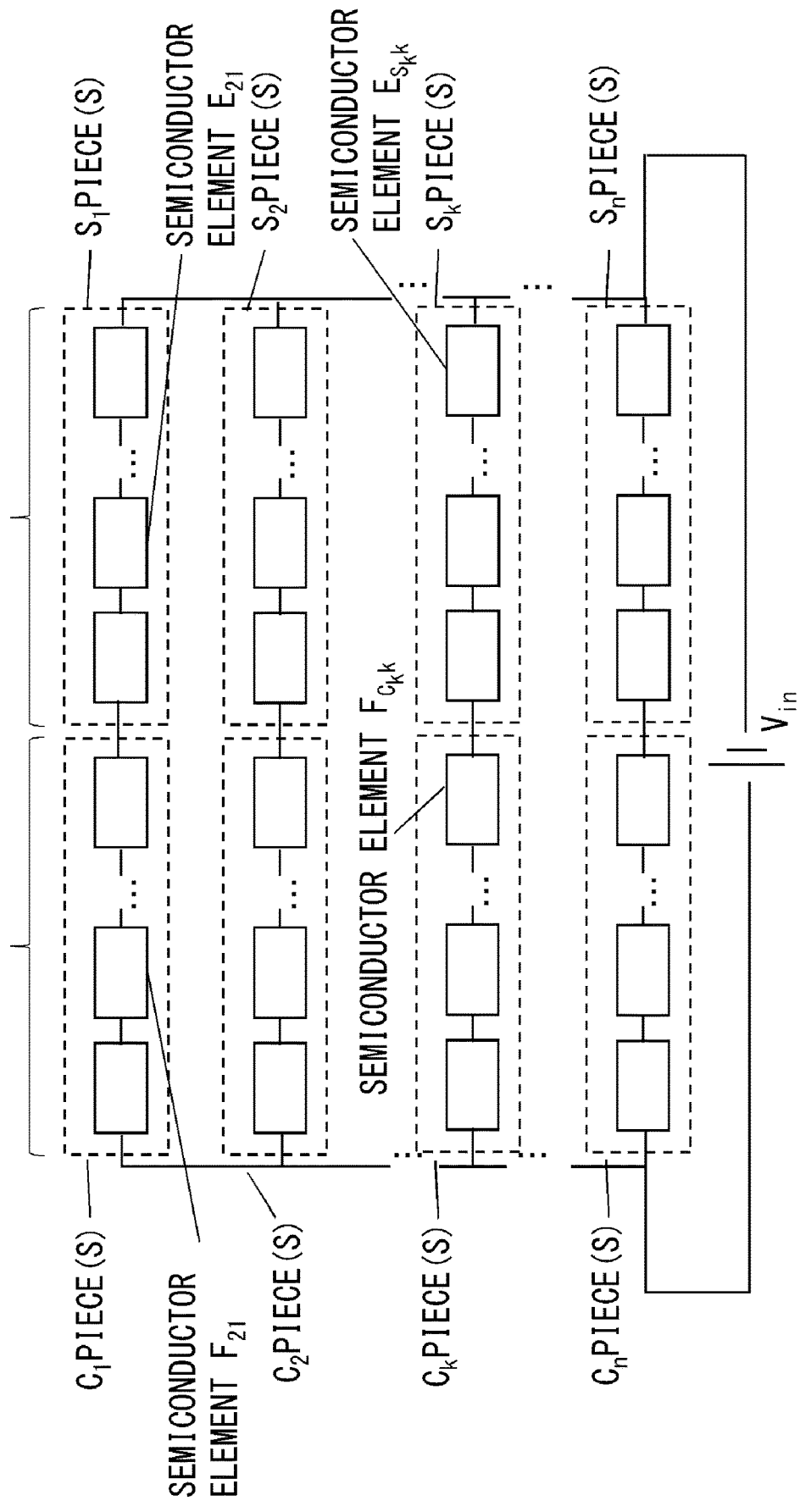
FIG. 25 is a diagram illustrating an example of an equivalence circuit of the oscillator according to the embodiment.

As illustrated in FIG. 25, the $S_k$ piece(s) (k=1 to n) of semiconductor elements are each made up of a single semiconductor element or semiconductor elements $E_{ik}$ (i=1 to $S_k$) connected to each other in series. Also, the $C_k$ piece(s) (k=1 to n) of semiconductor elements are each made up of a single semiconductor element or semiconductor elements $F_{ik}$ (i=1 to $C_k$) connected to each other in series. The semiconductor elements will be assumed to exhibit negative resistance characteristics only in a range of driving voltage $V_{min}$ to $V_{max}$ when the direction of bias supply is forward, and in a range of driving voltage to $-V_{min'}$ to $-V_{max'}$, when the direction of bias supply is reverse. Note that $V_{min}>0$ and $V_{max}>0$, and $V_{min'}<0$ and $V_{max'}<0$ are satisfied here. Under these conditions, the cross-sectional areas of the semiconductor elements are adjusted in order to satisfy the following three conditions, in order to drive the semiconductor elements $E_{ik}$ in a negative resistance region, and also to apply equal voltage to all of the semiconductor elements $E_{ik}$. In a case in which there is fluctuation of voltage in the negative resistance region, the capacitance of the single semiconductor elements minutely fluctuates, and accordingly an equal voltage is applied to all semiconductor elements in order to make adjustment of capacitance more convenient in the present embodiment.

A first condition is that, with respect to any k and any i, i' (i≠i', 1≤i, and i'≤$S_k$), the voltage is equal among the semiconductor elements $E_{ik}$ and the semiconductor elements $E_{i'k}$. A second condition is that, with respect to any k, k' (k≠k', 1≤k, and k'≤n), the voltage is equal among the semiconductor elements $E_{ik}$ and the semiconductor elements $E_{ik'}$, and that driving is performed by voltage in the negative resistance region. A third condition is that, with respect to any k, semiconductor elements $F_{ik}$ are driven by voltage in the positive resistance region. The first condition is satisfied by the following Expression (2), the second condition is satisfied by Expression (6) and Expression (7), and the third condition is satisfied by Expression (8) and Expression (9).

$$A_{ik} = A_{i'k} \stackrel{\text{def}}{=} A_k \quad (2)$$

$$R_{total} = S_k \frac{\rho t}{A_k} + \sum_{i=1}^{C_k} \frac{\rho t}{B_{ik}} \quad (3)$$

$$V_{ik} = \frac{\frac{\rho t}{A_k}}{S_k \frac{\rho t}{A_k} + \sum_{i=1}^{C_k} \frac{\rho t}{B_{ik}}} \times V_{in} \quad (4)$$

$$V'_{ik} = \frac{\frac{\rho t}{B_{ik}}}{S_k \frac{\rho t}{A_k} + \sum_{i=1}^{C_k} \frac{\rho t}{B_{ik}}} \times V_{in} \quad (5)$$

$$V_{min} \leq \frac{\frac{\rho t}{A_k}}{S_k \frac{\rho t}{A_k} + \sum_{i=1}^{C_k} \frac{\rho t}{B_{ik}}} \times V_{in} = \quad (6)$$

$$\frac{\frac{\rho t}{A_{k'}}}{S_{k'} \frac{\rho t}{A_{k'}} + \sum_{i=1}^{C'_k} \frac{\rho t}{B_{ik'}}} \times V_{in} \leq V_{max}(V_{in} > 0)$$

$$-V'_{min} \leq \frac{\frac{\rho t}{A_k}}{S_k \frac{\rho t}{A_k} - \sum_{i=1}^{C_k} \frac{\rho t}{B_{ik}}} \times V_{in} = \quad (7)$$

$$\frac{\frac{\rho t}{A_{k'}}}{S_{k'} \frac{\rho t}{A_{k'}} + \sum_{i=1}^{C'_k} \frac{\rho t}{B_{ik'}}} \times V_{in} \leq -V'_{max}(V_{in} < 0)$$

$$0 < \frac{\frac{\rho t}{B_{ik}}}{S_k \frac{\rho t}{A_k} + \sum_{i=1}^{C_k} \frac{\rho t}{B_{ik}}} \times V_{in} < \quad (8)$$

$$V_{min} \text{ OR } \frac{\frac{\rho t}{B_{ik}}}{S_k \frac{\rho t}{A_k} + \sum_{i=1}^{C_k} \frac{\rho t}{B_{ik}}} \times V_{in} > V_{max}(V_{in} > 0)$$

or $$0 < \frac{\frac{\rho t}{B_{ik}}}{S_k \frac{\rho t}{A_k} + \sum_{i=1}^{C_k} \frac{\rho t}{B_{ik}}} \times V_{in} < \quad (9)$$

$$-V'_{min} \text{ OR } \frac{\frac{\rho t}{B_{ik}}}{S_k \frac{\rho t}{A_k} + \sum_{i=1}^{C_k} \frac{\rho t}{B_{ik}}} \times V_{in} > -V'_{max}(V_{in} < 0)$$

Here, $A_{ik}$ represents the cross-sectional area of semiconductor elements $E_{ik}$, $\rho$ represents resistivity, and t represents the film thickness. At this time, the resistance value $R_{ik}$ of the semiconductor elements $E_{ik}$ can be expressed as $R_{ik}=\rho t/A_{ik}$. In order to satisfy the first condition with respect to any k and any i, i' (i≠i', 1≤i, and i'≤$S_k$), $R_{ik}=R_{i'k}$ needs to hold, and accordingly the relation of Expression (2) needs to hold. The voltage applied to the semiconductor elements $E_{ik}$ is adjusted by introducing semiconductor elements $F_{ik}$.

Also, $B_{ik}$ represents the cross-sectional area of the semiconductor elements $F_{ik}$, $\rho$ represents resistivity, and t represents the film thickness. In FIG. 25, the combined resistance $R_{total}$ of the $C_k$ piece(s)+$S_k$ piece(s) of semiconductor elements is as in Expression (3). From Expression (2) and Expression (3), when the voltage of the power source is voltage $V_{in}$, the voltage $V_{ik}$ applied to the semiconductor elements $E_{ik}$ is as in Expression (4), and the voltage $V_{ik'}$ applied to the semiconductor elements $F_{ik}$ is as in Expression (5). From Expression (4), there is the need for the relations in Expression (6) and Expression (7) to hold in order to satisfy the second condition. In the same way, there is the need for the relations in Expression (8) and Expression (9) to hold in order to satisfy the third condition.

In the same way, conditions that the cross-sectional areas of the semiconductor elements should satisfy in the present embodiment, in a case such as in an equivalence circuit illustrated in FIG. 26, particularly in a case of being made up of $P_l$ piece(s) to $P_m$ piece(s) of semiconductor elements connected to each other in series, where N≥2, will be described. The $P_l$ piece(s) (l=1 to m) of semiconductor elements are each made up of a single semiconductor element or single semiconductor elements connected to each other in parallel, and exhibit negative resistance characteristics when driven by the power feed structure.

Figure 26:
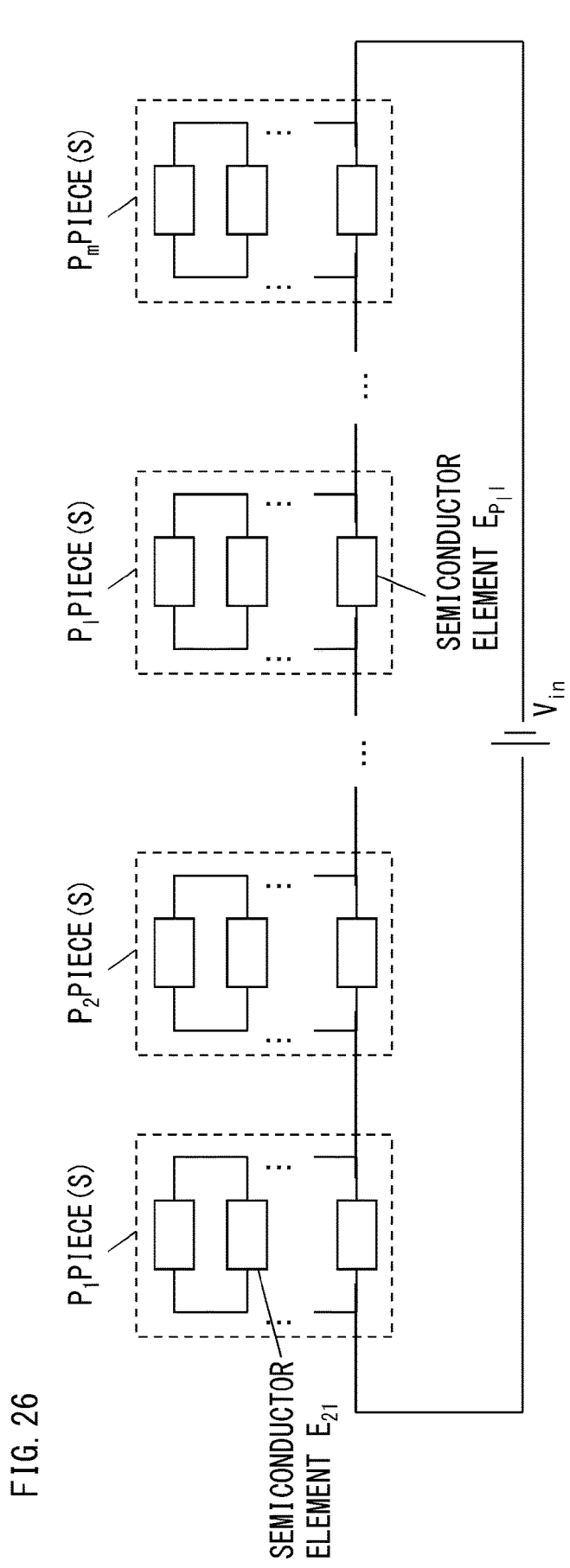
FIG. 26 is a diagram illustrating another example of an equivalence circuit of the oscillator according to the embodiment.

As illustrated in FIG. 26, the $P_l$ piece(s) (l=1 to m) of semiconductor elements are each made up of a single semiconductor element or semiconductor elements $E_{jl}$ (j=1 to $P_l$) connected to each other in parallel. The semiconductor elements will be assumed to exhibit negative resistance characteristics only in a range of driving voltage $V_{min}$ to $V_{max}$ when the direction of bias supply is forward, and in a range of driving voltage $-V_{min'}$ to $-V_{max'}$ when the direction of bias supply is reverse. Note that $V_{min} > 0$ and $V_{max} > 0$, and $V_{min'} < 0$ and $V_{max'} < 0$ are satisfied here. Under these conditions, the cross-sectional areas of the semiconductor elements are adjusted in order to satisfy the following condition, in order to drive the semiconductor elements $E_{jl}$ in a negative resistance region, and also to apply equal voltage to all of the semiconductor elements $E_{jl}$. In a case in which there is fluctuation of voltage in the negative resistance region, the capacitance of the single semiconductor elements minutely fluctuates, and accordingly an equal voltage is applied to all semiconductor elements in order to make adjustment of capacitance more convenient in the present embodiment. The condition is that, with respect to any l, l' (l≠l', 1≤l, and l'≤m), and j (j=1 to $P_j$), the voltage is equal among the semiconductor elements $E_{jl}$ and the semiconductor elements $E_{jl'}$, and that driving is performed by voltage in the negative resistance region.

$A_{jl}$ represents the cross-sectional area of the semiconductor elements $E_{jl}$, ρ represents resistivity, and t represents the film thickness. At this time, the resistance value $R_{jl}$ of the semiconductor elements $E_{jl}$ can be expressed as $R_{jl} = \rho t / A_{jl}$, using the cross-sectional area $A_{jl}$, the resistivity ρ, and the film thickness t. In FIG. 26, the combined resistance R_l of the $P_l$ piece(s) of semiconductor elements is as in Expression (10), and from Expression (10), the combined resistance $R_{total'}$ of the $P_l$ piece(s) to $P_m$ piece(s) of semiconductor elements is as in Expression (11). From Expression (11), when the voltage of the power source is $V_{in}$, the voltage $V_l$ applied to the $P_l$ piece(s) of semiconductor elements is as in Expression (12). There is the need for the relations in Expression (13) and Expression (14) to hold with regard to the cross-sectional areas $A_{jl}$ and $A_{jl'}$ of the semiconductor elements, and the voltages $V_{in}$, $V_{min}$ and $V_{max}$, and $V_{min'}$ and $V_{max'}$, applied to the $P_m$ piece(s) of semiconductor elements connected to each other in series. The above description is to be applied to the oscillators 100 according to the following Examples.

$$R_1 = \frac{1}{\sum_{j=1}^{P_l} \frac{A_{jl}}{\rho t}} \quad (10)$$

$$R'_{total} = \sum_{l=1}^{m} \frac{1}{\sum_{j=1}^{P_l} \frac{A_{jl}}{\rho t}} \quad (11)$$

$$V_l = \frac{\sum_{j=1}^{P_l} \frac{A_{jl}}{\rho t}}{\sum_{l=1}^{m} \frac{1}{\sum_{j=1}^{P_l} \frac{A_{jl}}{\rho t}}} \times V_{in} \quad (12)$$

$$V_{min} \leq \frac{\frac{1}{\sum_{j=1}^{P_l} \frac{A_{jl}}{\rho t}}}{\sum_{l=1}^{m} \frac{1}{\sum_{j=1}^{P_l} \frac{A_{jl}}{\rho t}}} \times V_{in} = \quad (13)$$

$$\frac{\frac{1}{\sum_{j=1}^{P_{l'}} \frac{A_{jl'}}{\rho t}}}{\sum_{l=1}^{m} \frac{1}{\sum_{j=1}^{P_l} \frac{A_{jl}}{\rho t}}} \times V_{in} \leq V_{max}(V_{in} > 0)$$

$$-V'_{min} \leq \frac{\frac{1}{\sum_{j=1}^{P_l} \frac{A_{jl}}{\rho t}}}{\sum_{l=1}^{m} \frac{1}{\sum_{j=1}^{P_l} \frac{A_{jl}}{\rho t}}} \times V_{in} = \quad (14)$$

$$\frac{\frac{1}{\sum_{j=1}^{P_{l'}} \frac{A_{jl'}}{\rho t}}}{\sum_{l=1}^{m} \frac{1}{\sum_{j=1}^{P_l} \frac{A_{jl}}{\rho t}}} \times V_{in} \leq -V'_{max}(V_{in} < 0)$$

Next, an example of processes of fabricating the oscillator common to each of the Examples described below will be described with reference to FIGS. 8A to 8F. Note that FIGS. 8A to 8F are cross-sectional diagrams taken along line A-A' in FIG. 1 with respect to the oscillator 100, for each process.

Figure 8A:
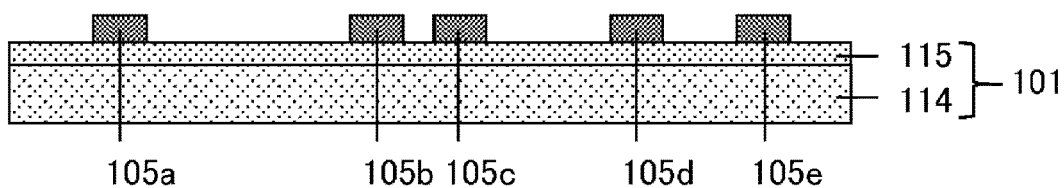
FIGS. 8A to 8F are diagrams illustrating processes of fabricating the oscillator according to the embodiment.
Figure 8B:
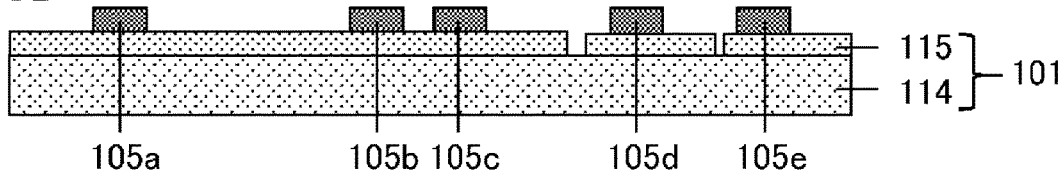
Figure 8C:
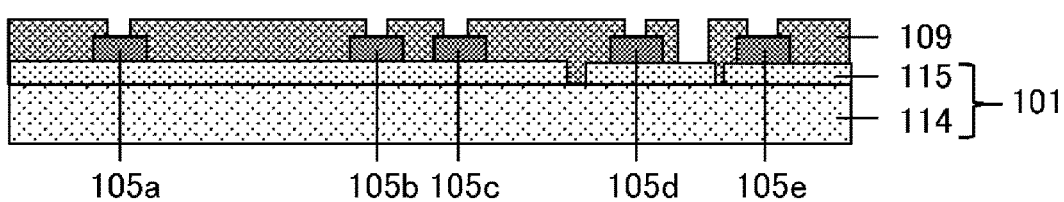
Figure 8D:
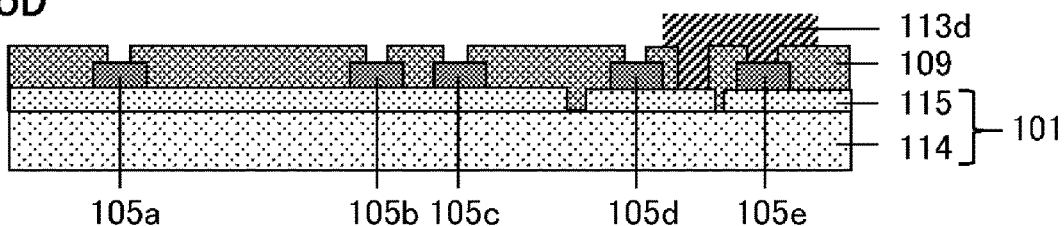
Figure 8E:
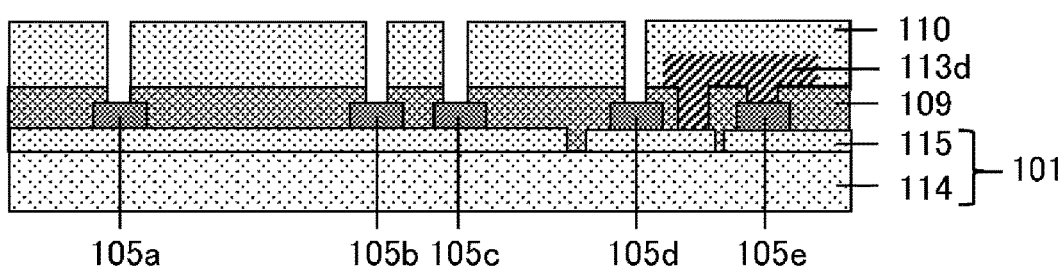
Figure 8F:
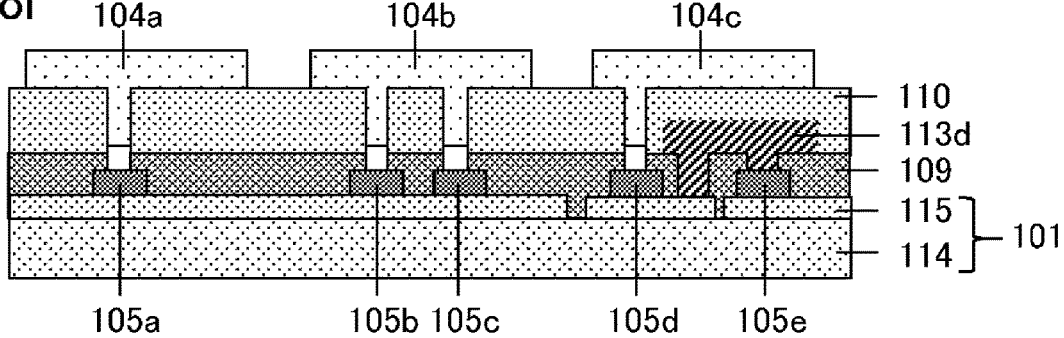

In FIG. 8A, semiconductor elements 105a to 105e that are epitaxially grown on the substrate 101 are formed into mesa forms by photolithography. In FIG. 8B, the substrate low-resistance layer 115 processed by photolithography. In FIG. 8C, the first insulator 109 is formed as a film above the semiconductor elements 105a to 105e, a substrate high-resistance layer 114, and the substrate low-resistance layer 115, and first contact holes are formed by photolithography. In FIG. 8D, the pads 112a to 112d and the conductors 113a to 113d are formed by photolithography. In FIG. 8E, a second insulator 110 is formed as a film, and second contact holes are formed by photolithography. In FIG. 8F, the antennas 104a to 104c are formed by photolithography. The above is the fabrication processes of the oscillator common to the Examples described below.

Example 1

Next, an oscillator according to Example 1 will be described with reference to FIGS. 9 and 2. FIG. 9 is a top view schematically illustrating an example of the oscillator 100 according to Example 1, and FIG. 2 corresponds to a cross-sectional view taken along line F-F' in FIG. 9. In the oscillator 100 according to the present Example, the oscillation structure 102a has the antenna 104a and the semiconductor element 105a, and the antenna 104a and the semiconductor element 105a are electrically connected to each other. The oscillation structure 102b has the antenna 104b, the semiconductor element 105b, and the semiconductor element 105c. The antenna 104b, the semiconductor element 105b, and the semiconductor element 105c are electrically connected to each other, and the semiconductor element 105b and the semiconductor element 105c are electrically connected to each other in parallel via the antenna 104b. The oscillation structure 102c has the antenna 104c, the semiconductor element 105d, and the semiconductor element 105e. The antenna 104c, the semiconductor element 105d, and the semiconductor element 105e are electrically connected to each other, and the semiconductor element 105d and the semiconductor element 105e are electrically connected to each other in series via the conductor 113d. The portion of the substrate low-resistance layer 115 connected to the semiconductor element 105d is not connected to any of the pads 112a to 112d. The power feed structure 103 has the power source 106 and the bias supply unit 107, and the bias supply unit 107 has the wiring 111 including wire bonding, the pads 112a to 112d, and the conductors 113a to 113c.

In the oscillator 100 according to Example 1, the semiconductor elements 105a to 105e exhibit negative resistance characteristics when driven by the power feed structure 103. Also, the oscillation structures 102a to 102c each have one antenna, and N piece(s) (N≥1) of semiconductor elements 105a to 105e that are electrically connected to the antenna. Also, out of the N piece(s) of semiconductor elements, P piece(s) (P≥0) of semiconductor elements are connected to each other in parallel, and S piece(s) (S≥0) of semiconductor elements are connected to each other in series. Also, in the example in FIG. 9, the direction of current flowing perpendicularly upward as to the substrate 101 (direction perpendicularly upward as to the plane of the Figure) is the forward direction. At this time, F piece(s) (F≥0) of semiconductor elements are supplied with bias in the forward direction, and R piece(s) (R≥0) of semiconductor elements are supplied with bias in the reverse direction. Note that this relation of forward direction and reverse direction in supplying bias is the same in the other Examples as well.

At this time, in the example illustrated in FIG. 9, bias is supplied to the oscillation structures 102a to 102c in the forward direction. Also, a case in which N=1, P=0, S=0, F=1, and R=0, corresponds to the oscillation structure 102a, a case in which N=2, P=2, S=0, F=2, and R=0, corresponds to the oscillation structure 102b, and a case in which N=2, P=0, S=2, F=2, and R=0, corresponds to the oscillation structure 102c. Note that in a case in which bias is supplied to the oscillation structures 102a to 102c in the reverse direction, the values of F and R are interchanged in each of the oscillation structures, and the values of N, P, and S are the same values.

In the oscillator 100 according to Example 1, electromagnetic waves of three types of oscillation frequencies can be simultaneously transmitted or received by the oscillation structures 102a to 102c. As one example, the capacitance $C_a$ of the antenna is set to 80 fF, the capacitance $C_d$ of the semiconductor elements 105a to 105e is set to 15 fF, and the oscillation frequency of one of the semiconductor elements 105a to 105e making up the oscillation structures in a case of forward-direction bias supply is 500 GHz. With the oscillation frequencies of the oscillation structure 102a, the oscillation structure 102b, and the oscillation structure 102c respectively represented by $f_1$, $f_2$, and $f_3$, $f_1$=500 GHz, $f_2$=465 GHz, and $f_3$=521 GHz are obtained.

Example 2

Figure 10:
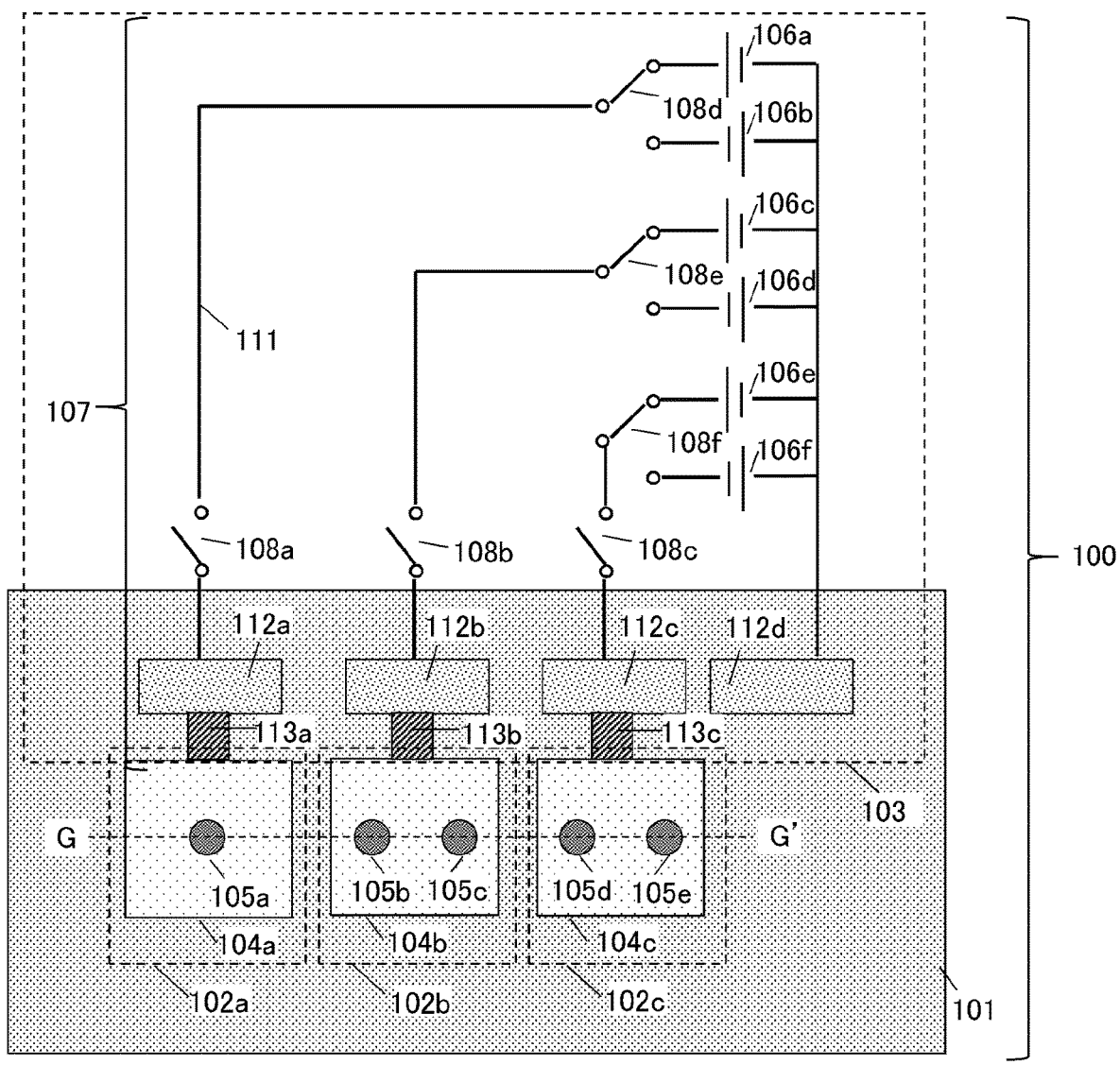
FIG. 10 is a top view schematically illustrating an example of an oscillator according to Example 2.

Next, an oscillator according to Example 2 will be described with reference to FIGS. 10 and 2. FIG. 10 is a top view schematically illustrating an example of the oscillator 100 according to Example 2, and FIG. 2 corresponds to a cross-sectional view taken along line G-G' in FIG. 10. In the oscillator 100 according to the present Example, the oscillation structure 102a has the antenna 104a and the semiconductor element 105a, and the antenna 104a and the semiconductor element 105a are electrically connected to each other. The oscillation structure 102b has the antenna 104b, the semiconductor element 105b, and the semiconductor element 105c. The antenna 104b, the semiconductor element 105b, and the semiconductor element 105c are electrically connected to each other, and the semiconductor element 105b and the semiconductor element 105c are electrically connected to each other in parallel via the antenna 104b. The oscillation structure 102c has the antenna 104c, the semiconductor element 105d, and the semiconductor element 105e. The antenna 104c, the semiconductor element 105d, and the semiconductor element 105e are electrically connected to each other, and the semiconductor element 105d and the semiconductor element 105e are electrically connected to each other in series via the conductor 113d. The portion of the substrate low-resistance layer 115 connected to the semiconductor element 105d is not connected to any of the pads 112a to 112d. The power feed structure 103 has power sources 106a to 106f, the bias supply unit 107, and control units 108a to 108f, and the bias supply unit 107 has the wiring 111 including wire bonding, the pads 112a to 112d, and the conductors 113a to 113c.

In the oscillator 100 according to Example 2, the direction of bias supplied to the oscillation structures 102a to 102c can be individually inverted between the forward direction and the reverse direction, by the control units 108d to 108f. Accordingly, in the power feed structure according to Example 2, the power sources connected to the semiconductor elements or the oscillation structures are switched by operations of the control units. Also, the oscillation structures 102a to 102c can be individually driven, or a plurality of oscillation structures can be simultaneously driven by the control units 108a to 108c. Accordingly, in the power feed structure according to Example 2, selection can be made between individual driving of the plurality of oscillation structures and simultaneous driving of the plurality of oscillation structures, by operations of the control unit.

In the oscillator 100 according to Example 2, the semiconductor elements 105a to 105e are supplied with bias by operations of the control units 108a to 108f of the power feed structure 103, and exhibit negative resistance characteristics. Also, the oscillation structures 102a to 102c each have one antenna, and N piece(s) (N≥1) of semiconductor elements that are electrically connected to the antenna. Also, out of the N piece(s) of semiconductor elements, P piece(s) (P≥0) of semiconductor elements are connected to each other in parallel, and out of the N piece(s) of semiconductor elements, S piece(s) (S≥0) are connected to each other in series. Also, F piece(s) (F≥0) of semiconductor elements are supplied with bias in the forward direction, and R piece(s) (R≥0) of semiconductor elements are supplied with bias in the reverse direction.

At this time, in the example illustrated in FIG. 10, assumption will be made that the control units 108a to 108f are controlled to supply bias to the oscillation structures 102a to 102c in the forward direction, for example. In this case, a case in which N=1, P=0, S=0, F=1, and R=0, corresponds to the oscillation structure 102a, a case in which N=2, P=2, S=0, F=2, and R=0, corresponds to the oscillation structure 102b, and a case in which N=2, P=0, S=2, F=2, and R=0, corresponds to the oscillation structure 102c. Also, assumption will be made that the control units 108a to 108f are controlled to supply bias to the oscillation structures 102a to 102c in the reverse direction, for example. In this case, a case in which N=1, P=0, S=0, F=0, and R=1, corresponds to the oscillation structure 102a, a case in which N=2, P=2, S=0, F=0, and R=2, corresponds to the oscillation structure 102b, and a case in which N=2, P=0, S=2, F=0, and R=2, corresponds to the oscillation structure 102c.

In the oscillator 100 according to Example 2, electromagnetic waves of three types of oscillation frequencies can be individually transmitted or received, or simultaneously transmitted or received. The direction of bias supplied to the oscillation structures 102a to 102c can be inverted by the control units 108d to 108f. The oscillation structure 102a alone can be driven by turning the control unit 108a and the control unit 108d to on, and the control unit 108b and 108c to off. The oscillation structure 102b alone or the oscillation structure 102c alone can be driven by causing the control units 108b and 108e and the control units 108c and 108f to operate in the same way. Further, a plurality of oscillation structures can be driven simultaneously by the control units 108a to 108f. When supplying forward bias to the oscillation structures 102a to 102c by the control units 108d to 108f, the capacitance $C_a$ of the antenna is set to 80 fF, and the capacitance $C_d$ of the semiconductor elements 105a to 105e is set to 15 fF in a case of forward bias supply. Also, the oscillation frequency of one of the semiconductor elements 105a to 105e making up the oscillation structures in a case of forward bias supply is 500 GHz. With the oscillation frequencies of the oscillation structure 102a, the oscillation structure 102b, and the oscillation structure 102c respectively represented by $f_1$, $f_2$, and $f_3$, $f_1$=500 GHz, $f_2$=465 GHz, and $f_3$=521 GHz are obtained at this time.

Example 3

Figure 11:
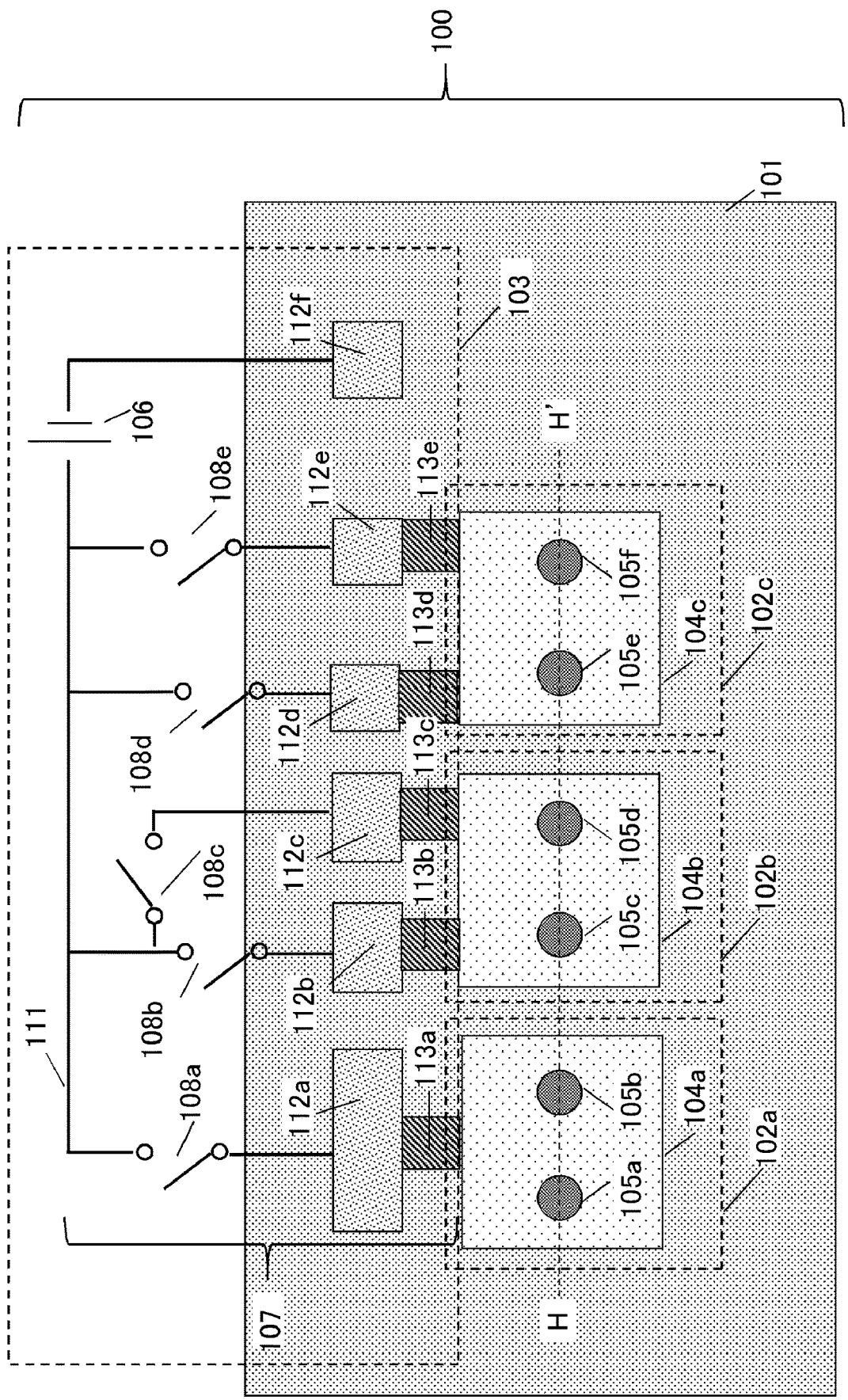
FIG. 11 is a top view schematically illustrating an example of an oscillator according to Example 3.
Figure 12:
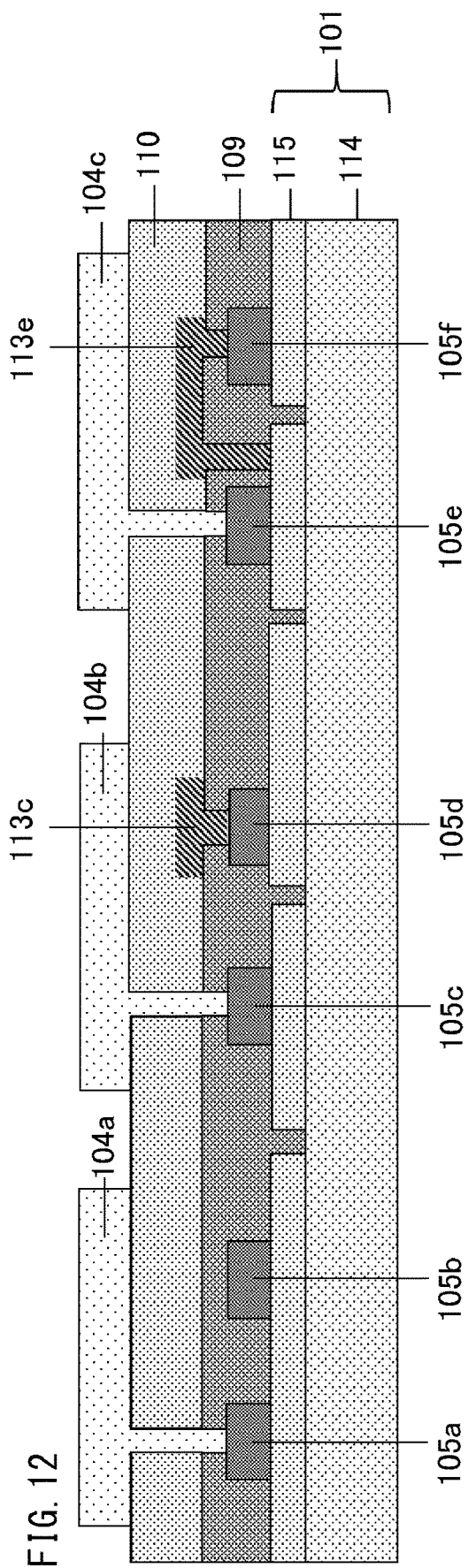
FIG. 12 is a cross-sectional view taken along line H-H' in FIG. 11.
Figure 13:
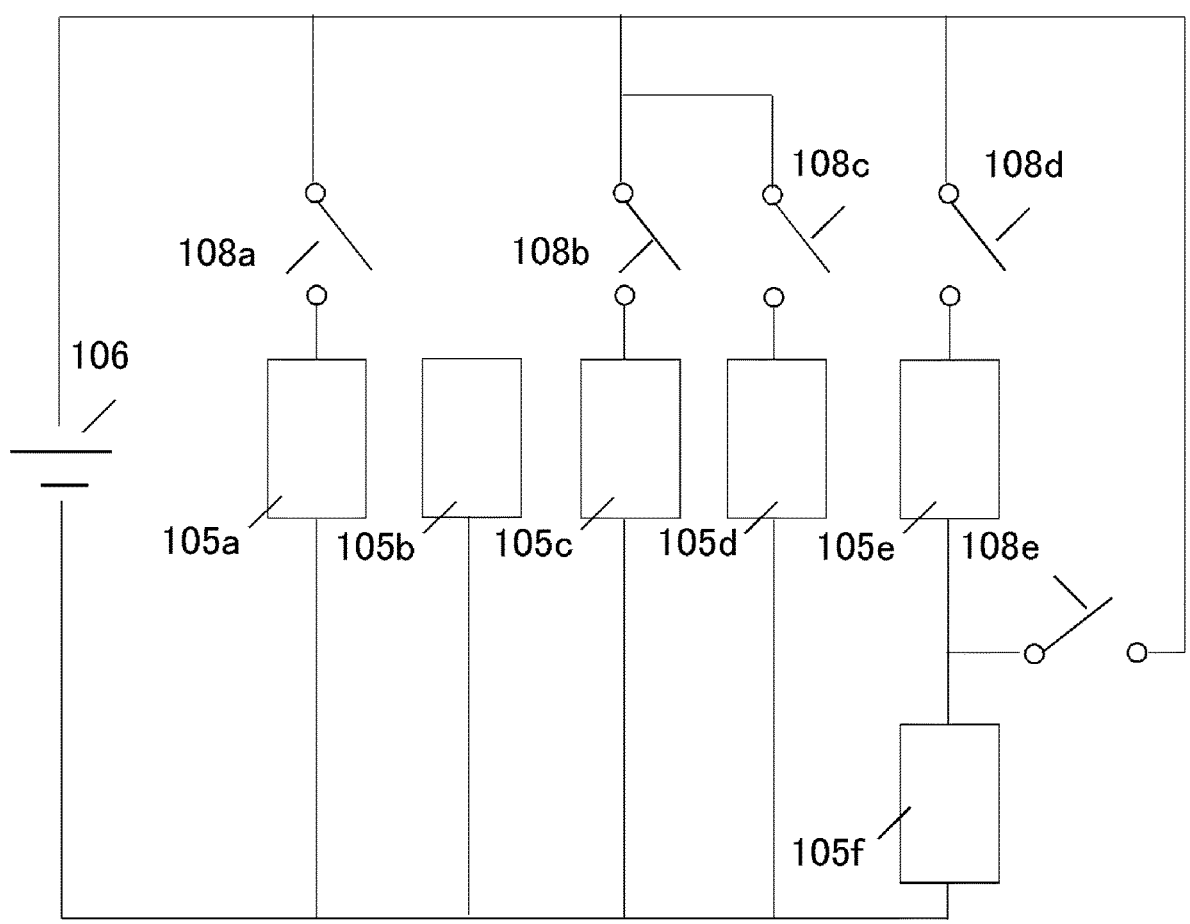
FIG. 13 is a diagram illustrating an equivalence circuit with focus on semiconductor elements in the oscillator according to Example 3.

Next, an oscillator according to Example 3 will be described with reference to FIGS. 11 to 13. FIG. 11 is a top view schematically illustrating an example of the oscillator according to Example 3, and FIG. 12 is a cross-sectional view taken along line H-H' in FIG. 11. FIG. 13 is a diagram illustrating an equivalence circuit of the oscillator 100 according to Example 3, focusing on semiconductor elements 105a to 105f alone for the sake of brevity. In the oscillator 100 according to the present Example, the oscillation structure 102a has the antenna 104a and the semiconductor element 105a, and the antenna 104a and the semiconductor element 105a are electrically connected to each other. Note that a uniform layout of two semiconductor elements each is implemented in the oscillator in order to stabilize the formation process when forming the semiconductor elements 105, and accordingly the semiconductor element 105b exists but is electrically isolated.

Also, the oscillation structure 102b has the antenna 104b and the semiconductor elements 105c and 105d, and the antenna 104b, and the semiconductor element 105c are electrically connected to each other. The oscillation structure 102c has the antenna 104c, and the semiconductor elements 105e and 105f. Also, the antenna 104c, the semiconductor element 105e, and the semiconductor element 105f are electrically connected to each other, and the semiconductor element 105e and the semiconductor element 105f are electrically connected to each other in series via a conductor 113e. The conductor 113c is electrically connected to the semiconductor element 105d. The conductor 113e is electrically connected to the semiconductor element 105f. A pad 112f is electrically connected to the substrate low-resistance layer 115, and is electrically connected to the semiconductor elements 105a, 105b, 105c, 105d, and 105f, and the first insulator 109, via the substrate low-resistance layer 115. The power feed structure 103 has the power source 106, the bias supply unit 107, and the control units 108a to 108e, and the bias supply unit 107 has the wiring 111 including wire bonding, pads 112a to 112f, and conductors 113a to 113e.

The semiconductor elements 105a to 105e are supplied with bias by operations of the control units 108a to 108e of the power feed structure 103, and exhibit negative resistance characteristics. Also, the oscillation structures according to Example 3 each have one antenna, and N piece(s) (N≥1) of semiconductor elements that are electrically connected to the antenna. Also, out of the N piece(s) of semiconductor elements, P piece(s) (P≥0) of semiconductor elements are connected to each other in parallel, and out of the N piece(s) of semiconductor elements, S piece(s) (S≥0) of semiconductor elements are connected to each other in series. Also, F piece(s) (F≥0) of semiconductor elements are supplied with bias in the forward direction, and R piece(s) (R≥0) of semiconductor elements are supplied with bias in the reverse direction.

At this time, in the example illustrated in FIG. 11, bias is applied to the oscillation structures 102a to 102c in the forward direction. When the control unit 108a is turned to on, the oscillation structure 102a is an oscillation structure in which N=1, P=0, S=0, F=1, and R=0. When the control unit 108b and the control unit 108c are both turned to on, the oscillation structure 102b is an oscillation structure in which N=2, P=2, S=0, F=2, and R=0. When the control unit 108d is turned to on and the control unit 108e is turned to off, the oscillation structure 102c is an oscillation structure in which N=2, P=0, S=2, F=2, and R=0. Note that in a case in which bias is supplied to the oscillation structures 102a to 102c in the reverse direction, the values of F and R are interchanged in each of the oscillation structures, and the values of N, P, and S are the same values.

In the oscillator 100 according to Example 3, electromagnetic waves of three types of oscillation frequencies can be individually transmitted or received, or simultaneously transmitted or received. The oscillation structure 102a alone can be driven by turning just the control unit 108a to on and the control units 108b to 108e to off. The oscillation structure 102b alone or the oscillation structure 102c alone can be driven by causing the control units 108b and 108c and the control units 108d and 108e to operate in the same way. Further, a plurality of oscillation structures can be driven simultaneously by the control units 108a to 108e. When supplying forward bias to the oscillation structures 102a to 102c by the control units 108a to 108e, the capacitance $C_a$ of the antenna is set to 80 fF, and the capacitance $C_d$ of the semiconductor elements 105a to 105f is set to 15 fF. Also, the oscillation frequency of one of the semiconductor elements 105a to 105f making up the oscillation structures in a case of forward-direction bias supply is 500 GHz. The oscillation frequency of the oscillation structure 102a when the control unit 108a is turned to on is represented by $f_1$, and the oscillation frequency of the oscillation structure 102b when the control unit 108b and the control unit 108c are both turned to on is represented by $f_2$. Also, the oscillation frequency of the oscillation structure 102c when the control unit 108d is turned to on and the control unit 108e is turned to off is represented by $f_3$. At this time, $f_1$=500 GHz, $f_2$=465 GHz, and $f_{3=521}$ GHz are obtained.

Example 4

Figure 14:
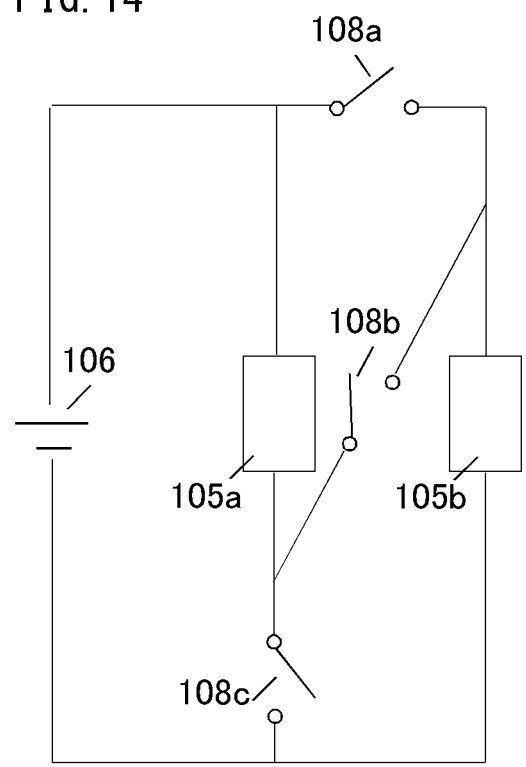
FIG. 14 is a diagram illustrating an equivalence circuit with focus on semiconductor elements in the oscillator according to Example 4.

Next, an oscillator according to Example 4 will be described with reference to FIGS. 5 to 7 and 14. FIG. 5 is a top view schematically illustrating an example of the oscillator according to Example 4, FIG. 6 is a cross-sectional view taken along line D-D' in FIG. 5, and FIG. 7 is a cross-sectional view taken along line E-E' in FIG. 5. FIG. 14 is an equivalence circuit of the oscillator 100 according to Example 4, with focus on semiconductor elements 105 alone for the sake of brevity. In the oscillator 100 according to the present Example, the oscillation structure 102a has the antenna 104a, the semiconductor element 105a, and the semiconductor element 105b, and the antenna 104a and the semiconductor element 105a are electrically connected to each other. The conductor 113b is electrically connected to the semiconductor element 105b. The pad 112c and the pad 112d are electrically connected to the substrate low-resistance layer 115, and the pad 112c is electrically connected to the semiconductor element 105a via the substrate low-resistance layer 115. The pad 112d is electrically connected to the semiconductor element 105b and the first insulator 109 via the substrate low-resistance layer 115. The power feed structure 103 has the power source 106, the bias supply unit 107, and the control units 108a to 108c, and the bias supply unit 107 has the wiring 111 including wire bonding, the pads 112a to 112d, and the conductors 113a and 113b. Upon turning the control unit 108a to off, the control unit 108b to off, and the control unit 108c to on, the semiconductor element 105b is electrically insulated. Upon turning the control unit 108a to on, the control unit 108b to off, and the control unit 108c to on, the semiconductor element 105a and the semiconductor element 105b are electrically connected to each other in parallel. Upon turning the control unit 108a to off, the control unit 108b to on, and the control unit 108c to off, the semiconductor element 105a and the semiconductor element 105b are electrically connected to each other in series.

In the oscillator 100 according to Example 4, the semiconductor elements 105a and 105b are supplied with bias by operations of the control units 108a to 108c of the power feed structure 103, and exhibit negative resistance characteristics. Also, the oscillation structure 102a has one antenna, and N piece(s) (N≥1) of semiconductor elements that are electrically connected to the antenna. Also, out of the N piece(s) of semiconductor elements, P piece(s) (P≥0) of semiconductor elements are connected to each other in parallel, and out of the N piece(s) of semiconductor elements, S piece(s) (S≥0) of semiconductor elements are connected to each other in series. Also, F piece(s) (F≥0) of semiconductor elements are supplied with bias in the forward direction, and R piece(s) (R≥0) of semiconductor elements are supplied with bias in the reverse direction.

At this time, in the example illustrated in FIG. 5, bias is applied to the oscillation structure 102a in the forward direction. In accordance with Table 1 below, when the control unit 108a is turned to off, the control unit 108b to off, and the control unit 108c to on, the oscillation structure 102a is an oscillation structure in which N=1, P=0, S=0, F=1, and R=0. When the control unit 108a is turned to on, the control unit 108b to off, and the control unit 108c to on, the oscillation structure 102a is an oscillation structure in which N=2, P=2, S=0, F=2, and R=0. Also, when the control unit 108a is turned to off, the control unit 108b to on, and the control unit 108c to off, the oscillation structure 102a is an oscillation structure in which N=2, P=0, S=2, F=2, and R=0. Note that in a case in which bias is supplied to the oscillation structure 102a in the reverse direction, the values of F and R are interchanged in each of the oscillation structures, and the values of N, P, and S are the same values.

In the oscillator 100 according to Example 4, electromagnetic waves of three types of oscillation frequencies can be transmitted or received with a single oscillation structure. The capacitance $C_a$ of the antenna is set to 80 fF, and the capacitance $C_d$ of the semiconductor elements 105a and 105b is set to 15 fF. Also, the oscillation frequency of one of the semiconductor elements 105a and 105b making up the oscillation structure in a case of forward-direction bias supply is 500 GHz. With the three types of oscillation frequencies respectively represented by $f_1$, $f_2$, and $f_3$, $f_1$=500 GHz, $f_2$=465 GHz, and $f_3$=521 GHz are obtained. From the equivalence circuit illustrated in FIG. 14, the correlation between the operations of the control units 108a to 108c and the oscillation frequencies $f_1$, $f_2$, and $f_3$ is as shown in Table 1.

TABLE 1

| CONTROL UNIT | $f_1$ | $f_2$ | $f_3$ |
|---|---|---|---|
| 108a | OFF | ON | OFF |
| 108b | OFF | OFF | ON |
| 108c | ON | ON | OFF |

Example 5

Figure 15:
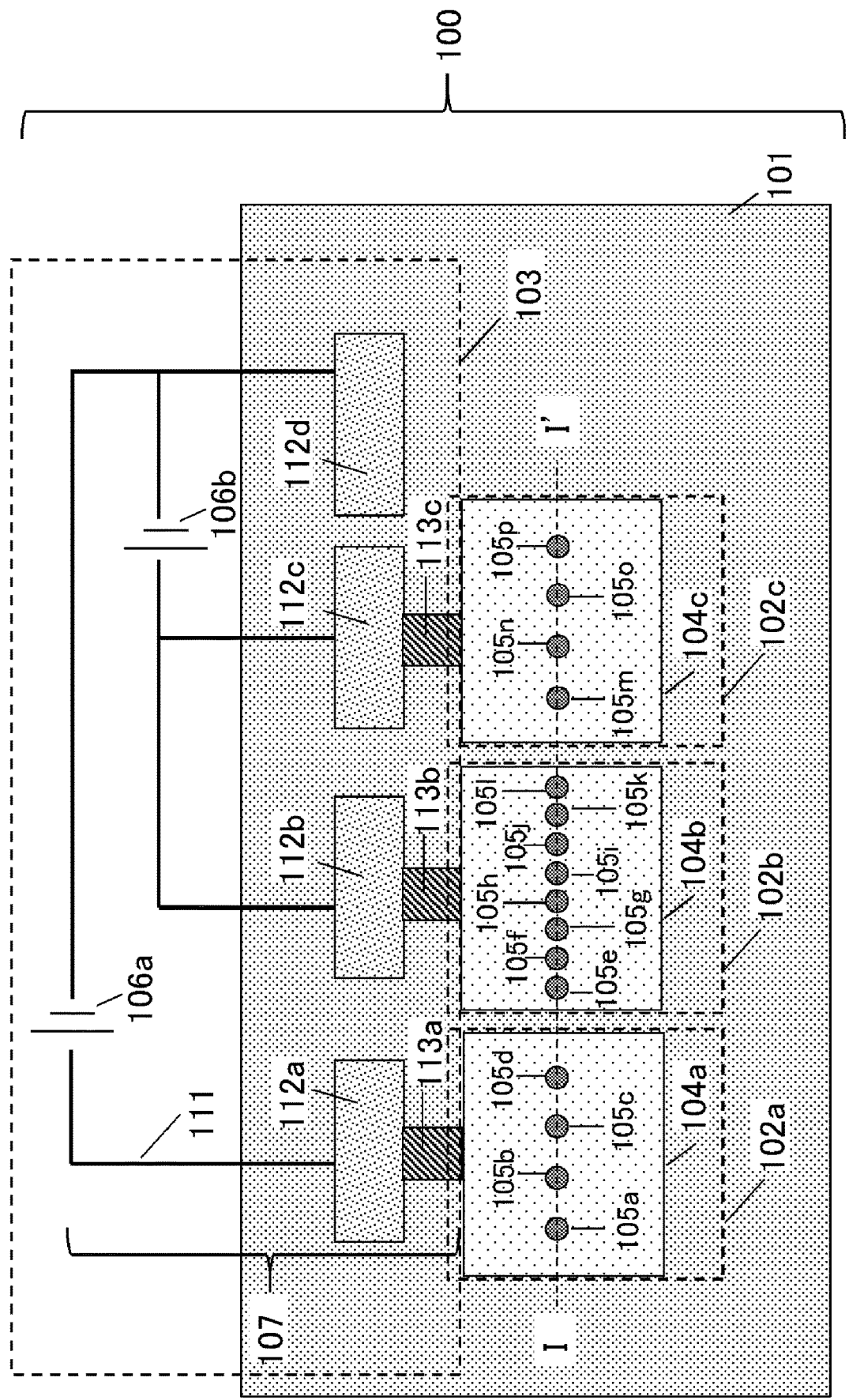
FIG. 15 is a top view schematically illustrating an example of an oscillator according to Example 5.
Figure 16:
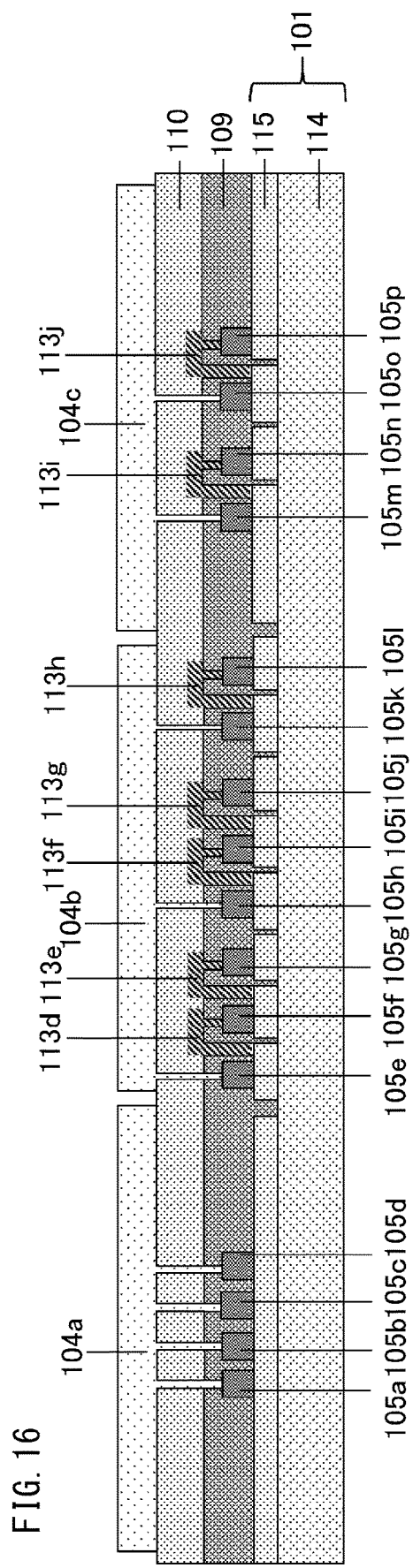
FIG. 16 is a cross-sectional view taken along line I-I' in FIG. 15.

Next, an oscillator according to Example 5 will be described with reference to FIGS. 15 and 16. FIG. 15 is a top view schematically illustrating an example of the oscillator according to Example 5, and FIG. 16 is a cross-sectional view taken along line I-I' in FIG. 15. In the oscillator 100 according to the present Example, the oscillation structure 102a has the antenna 104a and the semiconductor elements 105a to 105d. Also, the antenna 104a and the semiconductor elements 105a to 105d are electrically connected to each other, and the semiconductor elements 105a to 105d are electrically connected to each other in parallel via the antenna 104a. The oscillation structure 102b has the antenna 104b and semiconductor elements 105e to 105l, and the antenna 104b and the semiconductor elements 105e to 105l are electrically connected to each other. The semiconductor element 105e, the semiconductor element 105f, and the semiconductor element 105g are electrically connected to each other in series via the conductor 113d and the conductor 113e. The semiconductor element 105h, the semiconductor element 105i, and the semiconductor element 105j are electrically connected to each other in series via a conductor 113f and a conductor 113g. The semiconductor element 105k and the semiconductor element 105l are electrically connected to each other in series via a conductor 113h. The semiconductor elements 105e to 105g, the semiconductor elements 105h to 105j, and the semiconductor elements 105k and 105l, are electrically connected to each other in parallel via the antenna 104b. The oscillation structure 102c has the antenna 104c and semiconductor elements 105m to 105p, and the antenna 104c and the semiconductor elements 105m to 105p are electrically connected to each other. The semiconductor element 105m and the semiconductor element 105*n* are electrically connected to each other in series via a conductor 113*i*, and the semiconductor element 105*o* and the semiconductor element 105*p* are electrically connected to each other in series via a conductor 113*j*. The semiconductor elements 105*m* and 105*n*, and the semiconductor elements 105*o* and 105*p*, are electrically connected to each other in parallel via the antenna 104*c*.

The portions of the substrate low-resistance layer 115 connected to the semiconductor elements 105*e*, 105*f*, 105*h*, 105*i*, 105*k*, 105*m*, and 105*o*, are not connected to any of the pads 112*a* to 112*d*. The power feed structure 103 has the power sources 106*a* and 106*b* and the bias supply unit 107, and the bias supply unit 107 has the wiring 111 including wire bonding, the pads 112*a* to 112*d*, and the conductors 113*a* to 113*j*.

In the oscillator 100 according to Example 5, electromagnetic waves of three types of oscillation frequencies can be simultaneously transmitted or received. In the present Example, the semiconductor elements 105*a* to 105*p* exhibit negative resistance characteristics only in the range of 0.6 V to 1.3 V, when forward bias is being supplied. The cross-sectional areas of the semiconductor element 105*e* and the semiconductor element 105*f*, and the semiconductor element 105*h* and the semiconductor element 105*i*, which the oscillation structure 102*b* has, are adjusted so as to be driven in the positive resistance region.

The cross-sectional areas of cross-sections of the semiconductor elements 105*a* to 105*p* taken along a plane parallel to the substrate 101 (a plane parallel to the plane of the Figure) in plan view of the oscillator 100 are respectively represented by Aa to Ap. Note however, that Aa to Ap are the same with respect to a thickness direction. First, an arrangement is made in which, in the oscillation structure 102*b*, Ae=Af=2Ag, Ah=Ai=2Aj, and Ak=Al are satisfied, and in the oscillation structure 102*c*, Am=An and Ao=Ap are satisfied. At this time, when voltage of the power source 106*b* is 2 V, just the semiconductor elements 105*g*, 105*j*, 105*k*, 105*l*, 105*m*, 105*n*, 105*o*, and 105*p* in the oscillation structures 102*b* and 102*c* can be driven in the negative resistance region of 1 V. Further, when voltage of the power source 106*a* is 1 V, the semiconductor elements 105*a* to 105*d* can also be driven in the negative resistance region of 1 V. Also, in the oscillator 100 according to the present Example,
Aa=Ab=Ac=Ad=Ag=Aj=Ak=Al=Am=An=Ao=Ap is further satisfied.

The oscillator 100 according to Example 5 is made up of $S_1$ piece(s) to $S_n$ piece(s) of semiconductor elements that are connected to each other in parallel. Now, $S_k$ (k=1 to n) satisfies the following Expression (15).

$$\sum_{k=1}^{n} S_k = N, n \geq 2, S_k \geq 1 \quad (15)$$

The $S_k$ piece(s) of semiconductor elements are each made up of a single semiconductor element or single semiconductor elements that are connected to each other in series, and have negative resistance properties when being driven by the power feed structure 103. Also, the oscillator 100 according to Example 5 satisfies at least one of the following conditions (1) to (5).

(1) Different N among different oscillation structures
(2) Different n among different oscillation structures
(3) At least one of the $S_1$ to Sn of one oscillation structure is a value that does not exist in another oscillation structure
(4) Different F among different oscillation structures
(5) Different R among different oscillation structures In other words, the oscillator 100 satisfies one condition (1), (2), (3), (4) or (5), or the oscillator 100 may satisfy more than one of conditions (1) to (5). For example, the oscillator 100 may satisfy conditions (1) and (2), or the oscillator 100 may satisfy conditions (3), (4) and (5).

At this time, in the example illustrated in FIG. 15, bias is supplied in the forward direction to the oscillation structures 102*a* to 102*c*. Further, a case in which N=4, $S_1$=1, $S_2$=1, $S_3$=1, $S_4$=1, P=4, F=4, and R=0, corresponds to the oscillation structure 102*a*. Also, a case in which N=4, $S_1$=1, $S_2$=1, $S_3$=2, P=3, F=4, and R=0, corresponds to the oscillation structure 102*b*. Also, a case in which N=4, $S_1$=2, $S_2$=2, P=2, F=4, and R=0, corresponds to the oscillation structure 102*c*. Note that in a case in which bias is supplied to the oscillation structures 102*a* to 102*c* in the reverse direction, the values of F and R are interchanged in each of the oscillation structures, and the values of N, $S_k$, and P are the same values.

In the oscillator 100 according to Example 5, the capacitance $C_a$ of the antenna is set to 80 fF, and the capacitance $C_d$ of the semiconductor elements 105*a* to 105*d*, 105*g*, 105*j*, and 105*k* to 105*p* is set to 15 fF. Also, the oscillation frequency of one of the semiconductor elements 105*a* to 105*d*, 105*g*, 105*j*, and 105*k* to 105*p* making up the oscillation structure in a case of forward-direction bias supply is 500 GHz. With the oscillation frequencies at the oscillation structure 102*a*, the oscillation structure 102*b*, and the oscillation structure 102*c* respectively represented by $f_1$, $f_2$, and $f_3$, $f_1$=412 GHz, $f_2$=450 GHz, and $f_3$=500 GHz are obtained.

Example 6

Figure 17:
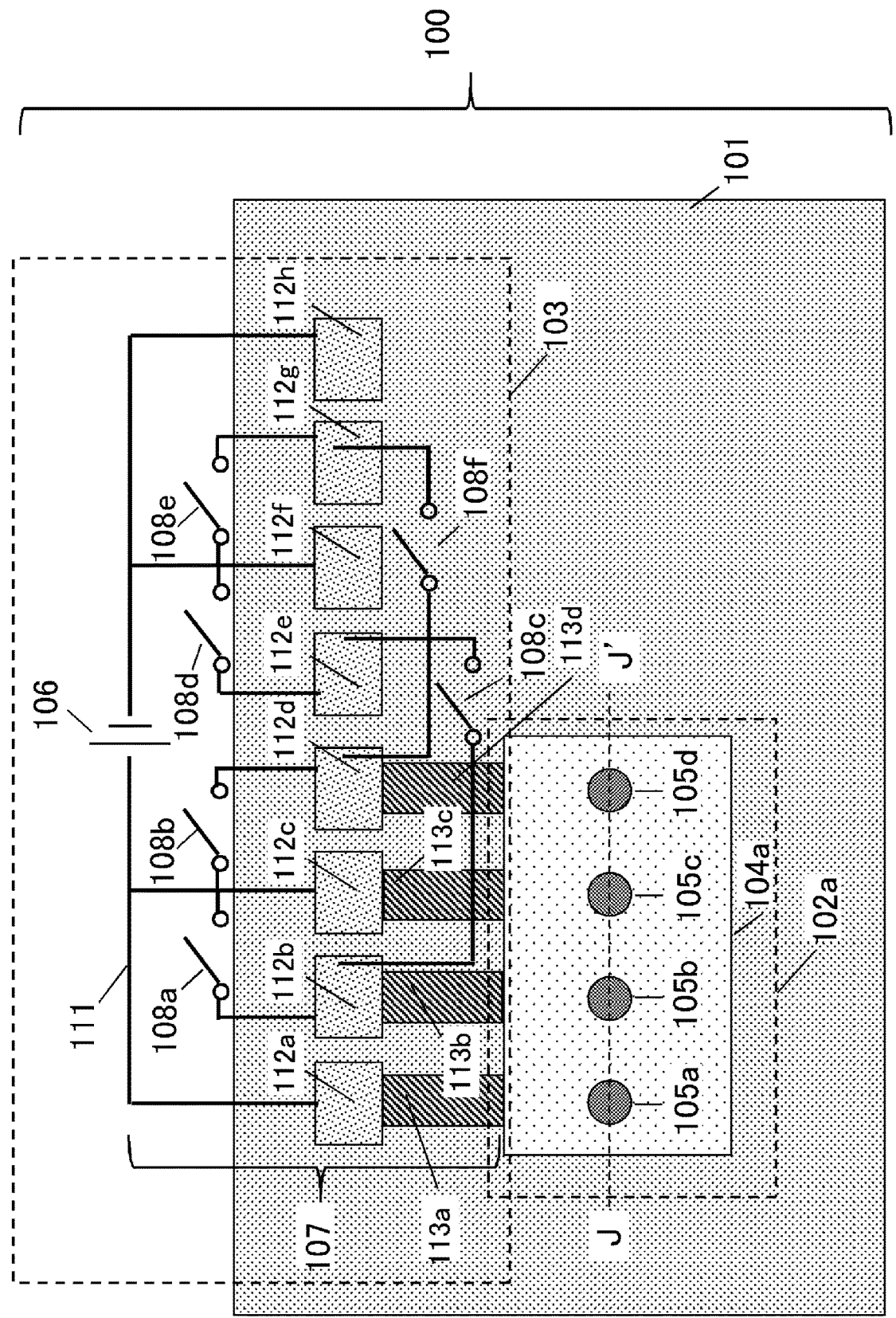
FIG. 17 is a top view schematically illustrating an example of an oscillator according to Example 6.
Figure 18:
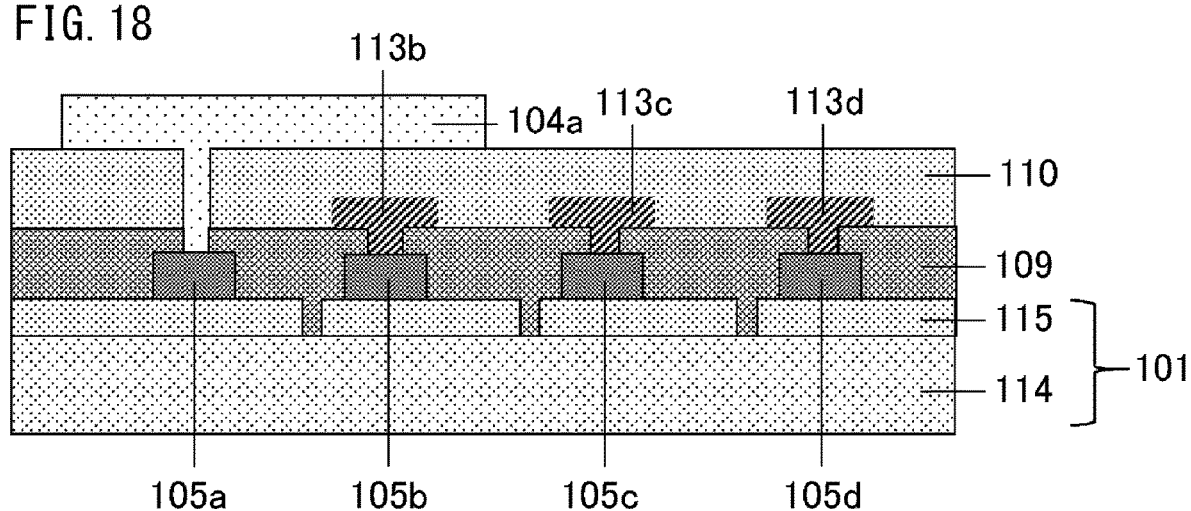
FIG. 18 is a cross-sectional view taken along line J-J' in FIG. 17.
Figure 19:
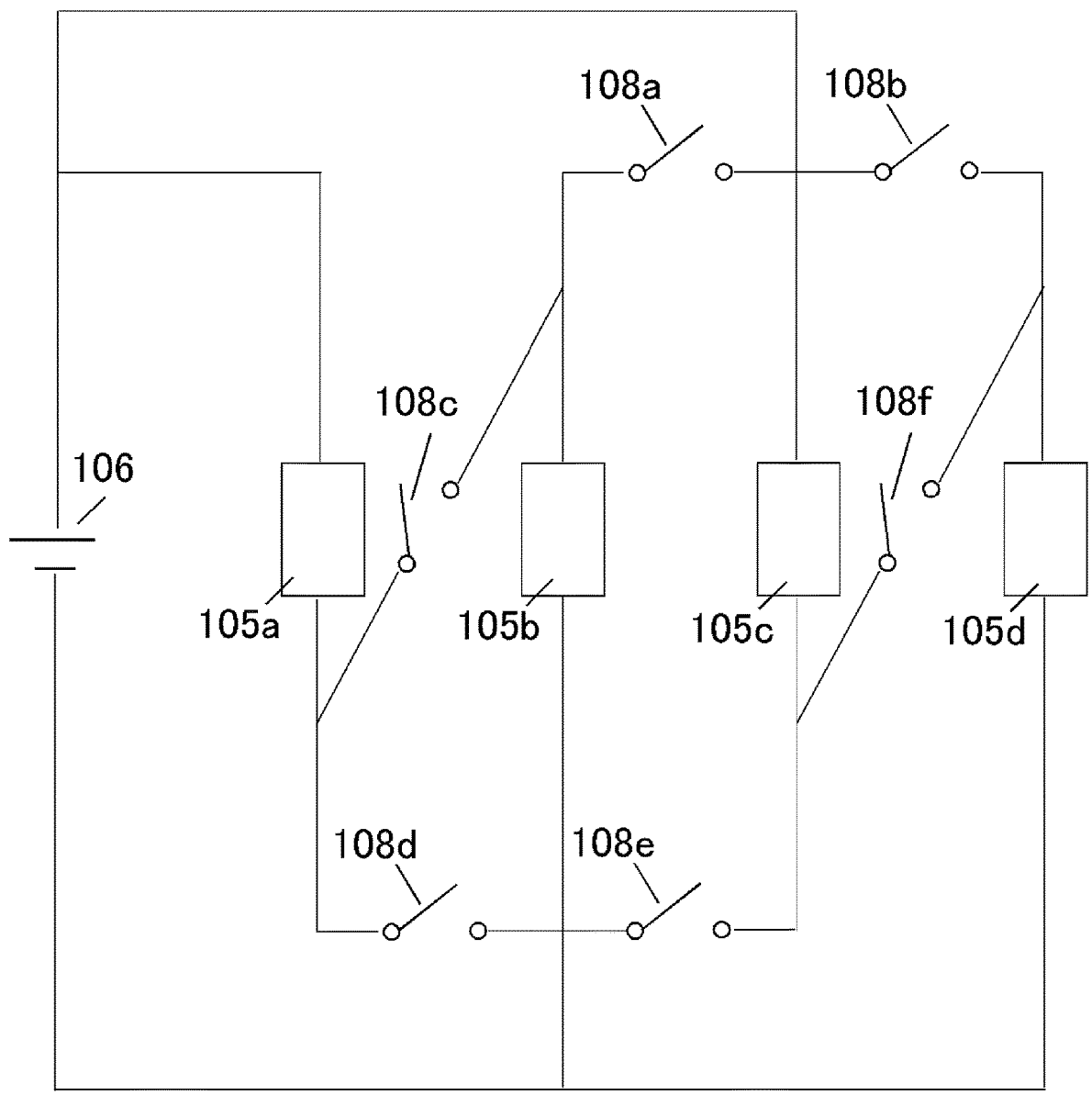
FIG. 19 is a diagram illustrating an equivalence circuit with focus on semiconductor elements in the oscillator according to Example 6.

Next, an oscillator according to Example 6 will be described with reference to FIGS. 17 to 19. FIG. 17 is a top view schematically illustrating an example of the oscillator according to Example 6, and FIG. 18 is a cross-sectional view taken along line J-J' in FIG. 17. FIG. 19 is an equivalence circuit of the oscillator according to Example 6, with focus just on the semiconductor elements 105*a* to 105*d* for the sake of brevity. In the oscillator according to the present Example, the oscillation structure 102*a* has the antenna 104*a* and the semiconductor elements 105*a* to 105*d*, and the antenna 104*a* and the semiconductor element 105*a* are electrically connected to each other. The conductor 113*b* is electrically connected to the semiconductor element 105*b*, the conductor 113*c* is electrically connected to the semiconductor element 105*c*, and the conductor 113*d* is electrically connected to the semiconductor element 105*d*. Pads 112*e* to 112*h* are electrically connected to the substrate low-resistance layer 115, the pad 112*e* is electrically connected to the semiconductor element 105*a* via the substrate low-resistance layer 115. The pad 112*f* is electrically connected to the semiconductor element 105*b* via the substrate low-resistance layer 115. The pad 112*g* is electrically connected to the semiconductor element 105*c* via the substrate low-resistance layer 115, and the pad 112*h* is electrically connected to the semiconductor element 105*d* and the first insulator 109 via the substrate low-resistance layer 115. The power feed structure 103 has the power source 106, the bias supply unit 107, and the control units 108*a* to 108*f*, and the bias supply unit 107 has the wiring 111 including wire bonding, the pads 112*a* to 112*h*, and the conductors 113*a* to 113*d*. Upon turning the control units 108a, 108b, 108d, and 108e to on, and the control units 108c and 108f to off, the semiconductor elements 105a to 105d are electrically connected to each other in parallel. Upon turning the control units 108a, 108d, and 108f to on, and the control units 108b, 108c, and 108e to off, the semiconductor element 105a, the semiconductor element 105b, and the semiconductor elements 105c and 105d are electrically connected to each other in parallel. Upon turning the control units 108c and 108f to on, and the control units 108a, 108b, 108d, and 108e to off, the semiconductor elements 105a and 105b, and the semiconductor elements 105c and 105d are electrically connected to each other in parallel.

The oscillator 100 according to Example 6 is made up of $S_1$ piece(s) to $S_n$ piece(s) of semiconductor elements that are connected to each other in parallel. $S_k$ (k=1 to n) satisfies Expression (15), in the same way as in Example 5. Also, the $S_k$ piece(s) (k=1 to n) of semiconductor elements are each made up of a single semiconductor element or single semiconductor elements that are connected to each other in series, and have negative resistance properties when being driven by the power feed structure 103. Also, the oscillator 100 according to Example 6 satisfies at least one of the following conditions (1) to (5).

(1) N changes by operations of control units
(2) n changes by operations of control units
(3) n changes to n' by operations of control units, and at least one of $S_1$ to $S_{n'}$ is a value that does not exist in the $S_1$ to $S_n$
(4) F changes by operations of control units
(5) R changes by operations of control units At this time, in the example illustrated in FIG. 17, bias is supplied in the forward direction to the oscillation structure 102a. In accordance with Table 2 below, the control unit 108a is then turned to off, the control unit 108b to off, the control unit 108c to on, the control unit 108d to off, the control unit 108e to on, and the control unit 108f to off. At this time, the oscillation structure 102a is an oscillation structure in a case in which N=4, $S_1$=1, $S_2$=1, $S_3$=1, $S_4$=1, P=4, F=4, and R=0. Also, the control unit 108a is turned to off, the control unit 108b to on, the control unit 108c to on, the control unit 108d to off, the control unit 108e to off, and the control unit 108f to on. At this time, the oscillation structure 102a is an oscillation structure in a case in which N=4, $S_1$=1, $S_2$=1, $S_3$=2, P=3, F=4, and R=0. Also, the control unit 108a is turned to on, the control unit 108b to on, the control unit 108c to off, the control unit 108d to on, the control unit 108e to off, and the control unit 108f to on. At this time, the oscillation structure 102a is an oscillation structure in a case in which N=4, $S_1$=2, $S_2$=2, P=2, F=4, and R=0. Note that in a case in which bias is supplied to the oscillation structure 102a in the reverse direction, the values of F and R are interchanged in each of the oscillation structures, and the values of N, $S_k$, and P are the same values.

In the oscillator 100 according to Example 6, electromagnetic waves of three types of oscillation frequencies can be transmitted or received with just a single oscillation structure. The capacitance $C_a$ of the antenna is set to 80 fF, the capacitance $C_d$ of the semiconductor elements 105a to 105d is set to 15 fF, and the oscillation frequency of one of the semiconductor elements 105a to 105d making up of the oscillation structure 102a is 500 GHz. With the three types of oscillation frequencies respectively represented by $f_1$, $f_2$, and $f_3$, $f_1$=412 GHz, $f_2$=450 GHz, and $f_3$=500 GHz are obtained. From the equivalence circuit illustrated in FIG. 19, the correlation between the operations of the control units 108a to 108f and the oscillation frequencies $f_1$, $f_2$, and $f_3$ is as shown in Table 2.

TABLE 2

| CONTROL UNIT | $f_1$ | $f_2$ | $f_3$ |
|---|---|---|---|
| 108a | ON | ON | OFF |
| 108b | ON | OFF | OFF |
| 108c | OFF | OFF | ON |
| 108d | ON | ON | OFF |
| 108e | ON | OFF | OFF |
| 108f | OFF | ON | ON |

Example 7

Figure 20:
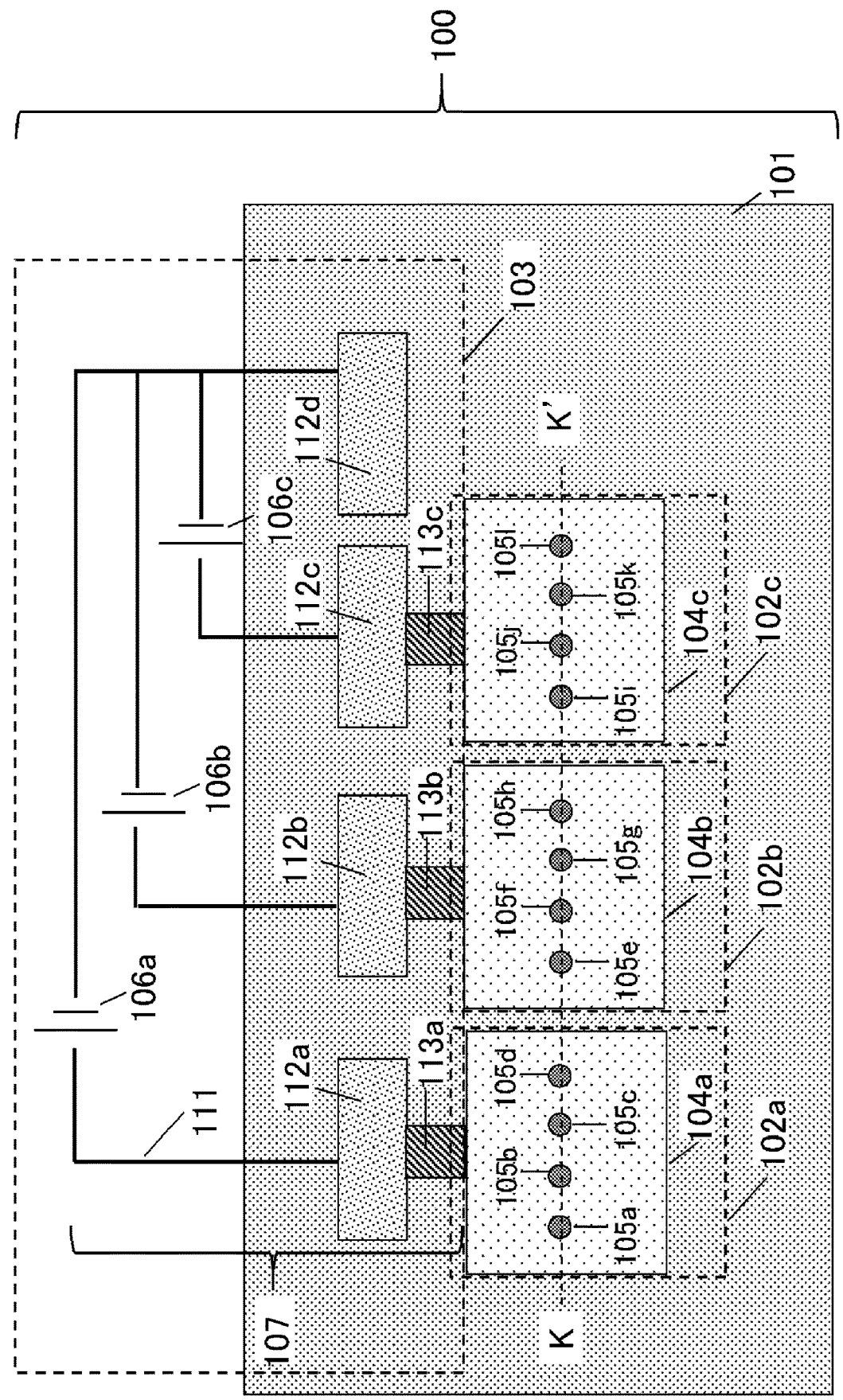
FIG. 20 is a top view schematically illustrating an example of an oscillator according to Example 7.
Figure 21:
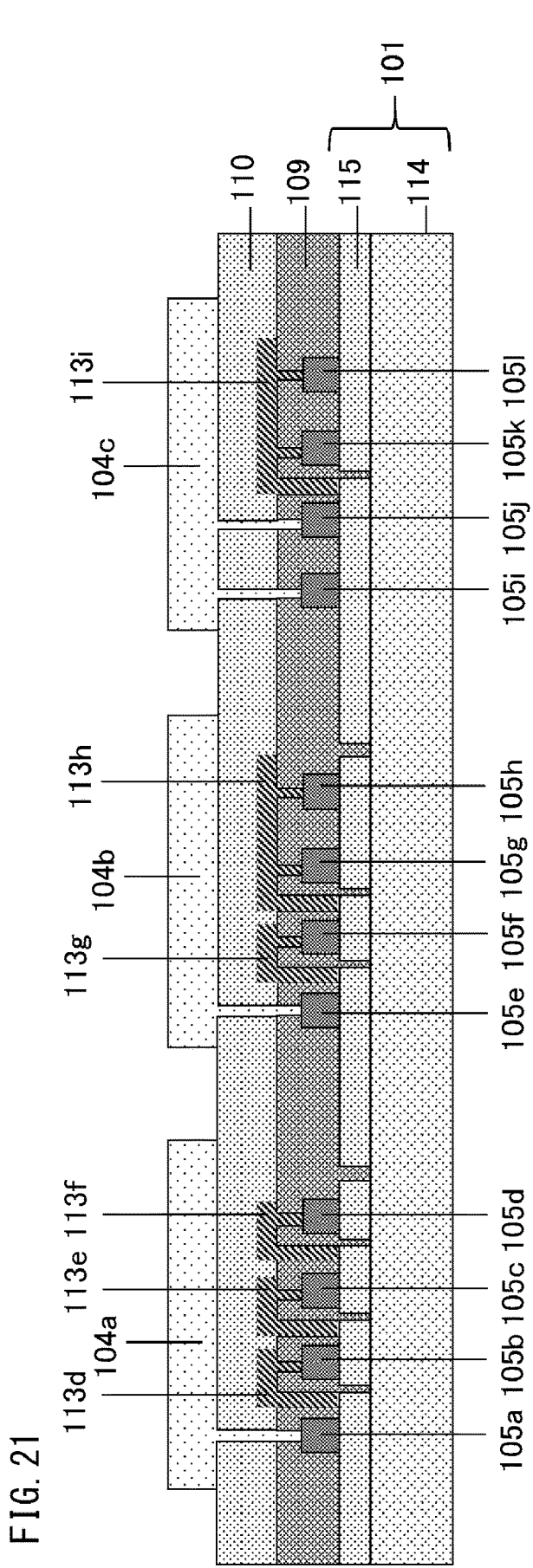
FIG. 21 is a cross-sectional view taken along line K-K' in FIG. 20.

Next, an oscillator according to Example 7 will be described with reference to FIGS. 20 and 21. FIG. 20 is a top view schematically illustrating an example of the oscillator according to Example 7, and FIG. 21 is a cross-sectional view taken along line K-K' in FIG. 20. In the oscillator according to the present Example, the oscillation structure 102a has the antenna 104a and the semiconductor elements 105a to 105d. The antenna 104a and the semiconductor elements 105a to 105d are electrically connected to each other, and the semiconductor elements 105a to 105d are electrically connected to each other in series, via the conductors 113d to 113f. The oscillation structure 102b has the antenna 104b and the semiconductor elements 105e to 105h. The antenna 104b and the semiconductor elements 105e to 105h are electrically connected to each other, and the semiconductor element 105e and the semiconductor element 105f are electrically connected to each other in series, via the conductor 113g. The semiconductor element 105g and the semiconductor element 105h are electrically connected to each other in parallel via the conductor 113h. The semiconductor element 105f and the semiconductor elements 105g and 105h are electrically connected to each other in series via the conductor 113h. The oscillation structure 102c has the antenna 104c and the semiconductor elements 105i to 105l. The antenna 104c and the semiconductor elements 105i to 105l are electrically connected to each other, and the semiconductor element 105i and the semiconductor element 105j are electrically connected to each other in parallel, via the antenna 104c. The semiconductor element 105k and the semiconductor element 105l are electrically connected to each other in parallel via the conductor 113i. The semiconductor element 105i and 105j, and the semiconductor elements 105k and 105l, are electrically connected to each other in series, via the conductor 113i. The portions of the substrate low-resistance layer 115 connected to the semiconductor elements 105a, 105b, 105c, 105e, 105f, 105i, and 105j, are not connected to any of the pads 112a to 112d. The power feed structure 103 has the power sources 106a, 106b, and 106c, and the bias supply unit 107, and the bias supply unit 107 has the wiring 111 including wire bonding, the pads 112a to 112d, and the conductors 113a to 113i.

In the oscillator 100 according to Example 7, electromagnetic waves of three types of oscillation frequencies can be simultaneously transmitted or received. In the present Example, the semiconductor elements 105a to 105l exhibit negative resistance characteristics only in the range of 0.6 V to 1.3 V, when forward bias is being supplied. The cross-sectional areas of cross-sections of the semiconductor elements 105a to 105l are respectively represented by Aa to Al. Note however, that Aa to Al are the same with respect to the thickness direction. An arrangement is made in which, in the oscillation structure 102a, Aa=Ab=Ac=Ad is satisfied. At this time, when the voltage of the power source 106a is 4 V, the semiconductor elements 105a to 105d can be driven in the negative resistance region of 1 V. An arrangement is made in which, in the oscillation structure 102b, Ae=Af=2Ag=2Ah is satisfied. At this time, when the voltage of the power source 106b is 3 V, the semiconductor elements 105e to 105h can be driven in the negative resistance region of 1 V. An arrangement is made in which, in the oscillation structure 102c, Ai=Aj=Ak=Al is satisfied. At this time, when the voltage of the power source 106c is 2 V, the semiconductor elements 105i to 105l can be driven in the negative resistance region of 1 V. Also, in the present Example, Aa=Ab=Ac=Ad=Ag=Ah=Ai=Aj=Ak=Al is further satisfied.

The oscillator 100 according to Example 7 is made up of $P_1$ piece(s) to $P_m$ piece(s) of semiconductor elements that are connected to each other in series. Now, $P_l$ (l=1 to m) satisfies the following Expression (16).

$$\sum_{l=1}^{m} P_l = N, m \geq 2, P_l \geq 1 \qquad (16)$$

The $P_l$ piece(s) of semiconductor elements are each made up of a single semiconductor element or single semiconductor elements that are connected to each other in parallel, and have negative resistance properties when being driven by the power feed structure 103. Also, the oscillator 100 according to Example 7 satisfies at least one of the following conditions (1) to (5).
(1) Different N among different oscillation structures
(2) Different m among different oscillation structures
(3) At least one of the $P_l$ to $P_m$ of one oscillation structure is a value that does not exist in another oscillation structure
(4) Different F among different oscillation structures
(5) Different R among different oscillation structures At this time, in the example illustrated in FIG. 20, bias is supplied in the forward direction to the oscillation structures 102a to 102c. Further, a case in which N=4, S=4, $P_1$=1, $P_2$=1, $P_3$=1, $P_4$=1, F=4, and R=0, corresponds to the oscillation structure 102a. Also, a case in which N=4, S=3, $P_1$=1, $P_2$=1, $P_3$=2, F=4, and R=0, corresponds to the oscillation structure 102b. Also, a case in which N=4, S=2, $P_1$=2, $P_2$=2, F=4, and R=0, corresponds to the oscillation structure 102c. Note that in a case in which bias is supplied to the oscillation structures 102a to 102c in the reverse direction, the values of F and R are interchanged in each of the oscillation structures, and the values of N, S, and $P_l$ are the same values.

In the oscillator 100 according to Example 7, the capacitance $C_a$ of the antenna is set to 80 fF, and the capacitance $C_d$ of the semiconductor elements 105a to 105d, and 105g to 105l, is set to 15 fF. Further, the oscillation frequency of one of the semiconductor elements 105a to 105f and 105i to 105l, making up the oscillation structures 102a to 102c is 500 GHz. With the oscillation frequencies of the oscillation structure 102a, the oscillation structure 102b, and the oscillation structure 102c, respectively represented by $f_1$, $f_2$, and $f_3$, $f_1$=533 GHz, $f_2$=514 GHz, and $f_3$=500 GHz are obtained.

Example 8

Figure 22:
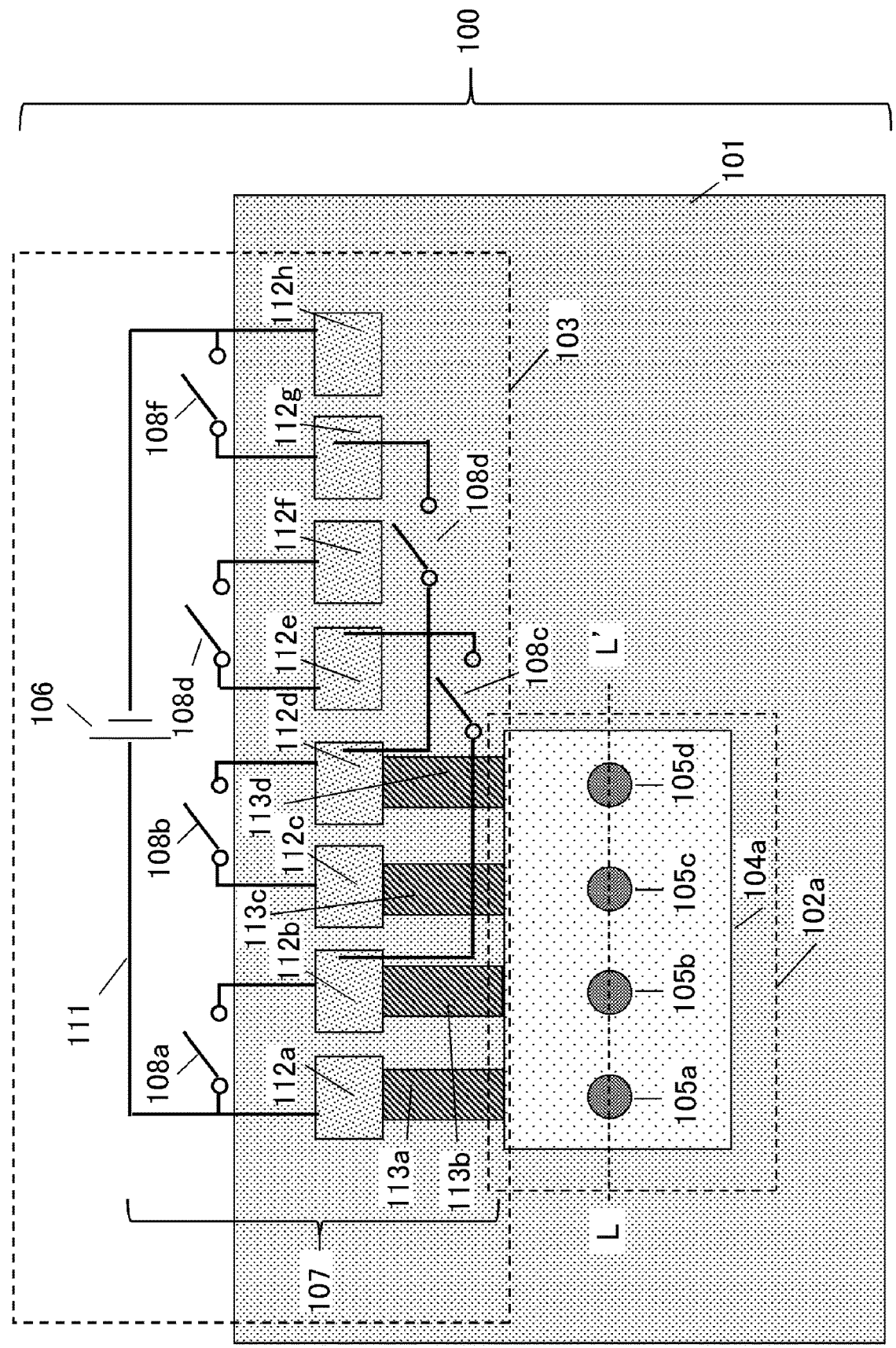
FIG. 22 is a top view schematically illustrating an example of an oscillator according to Example 8.
Figure 23:
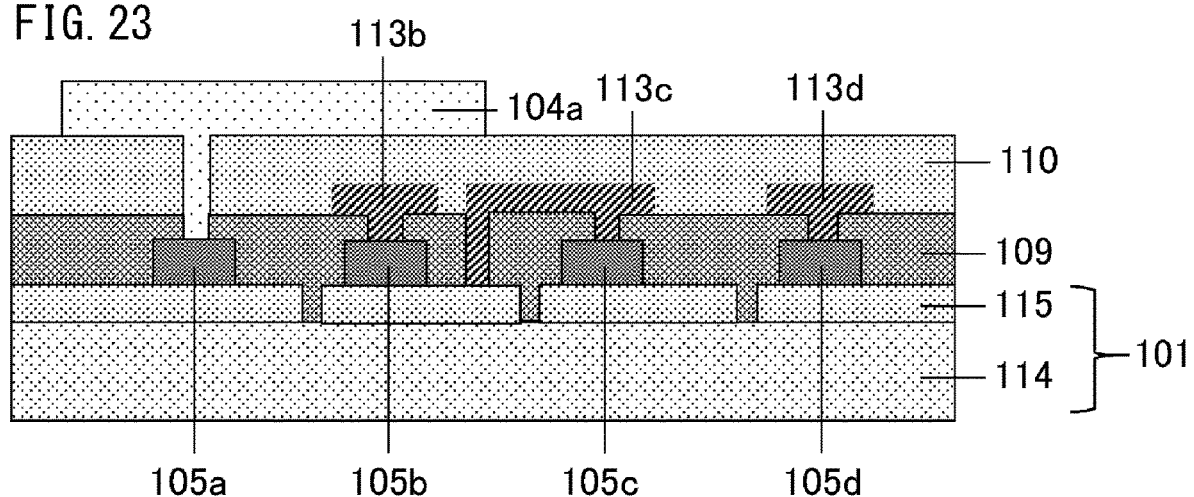
FIG. 23 is a cross-sectional view taken along line L-L' in FIG. 22.
Figure 24:
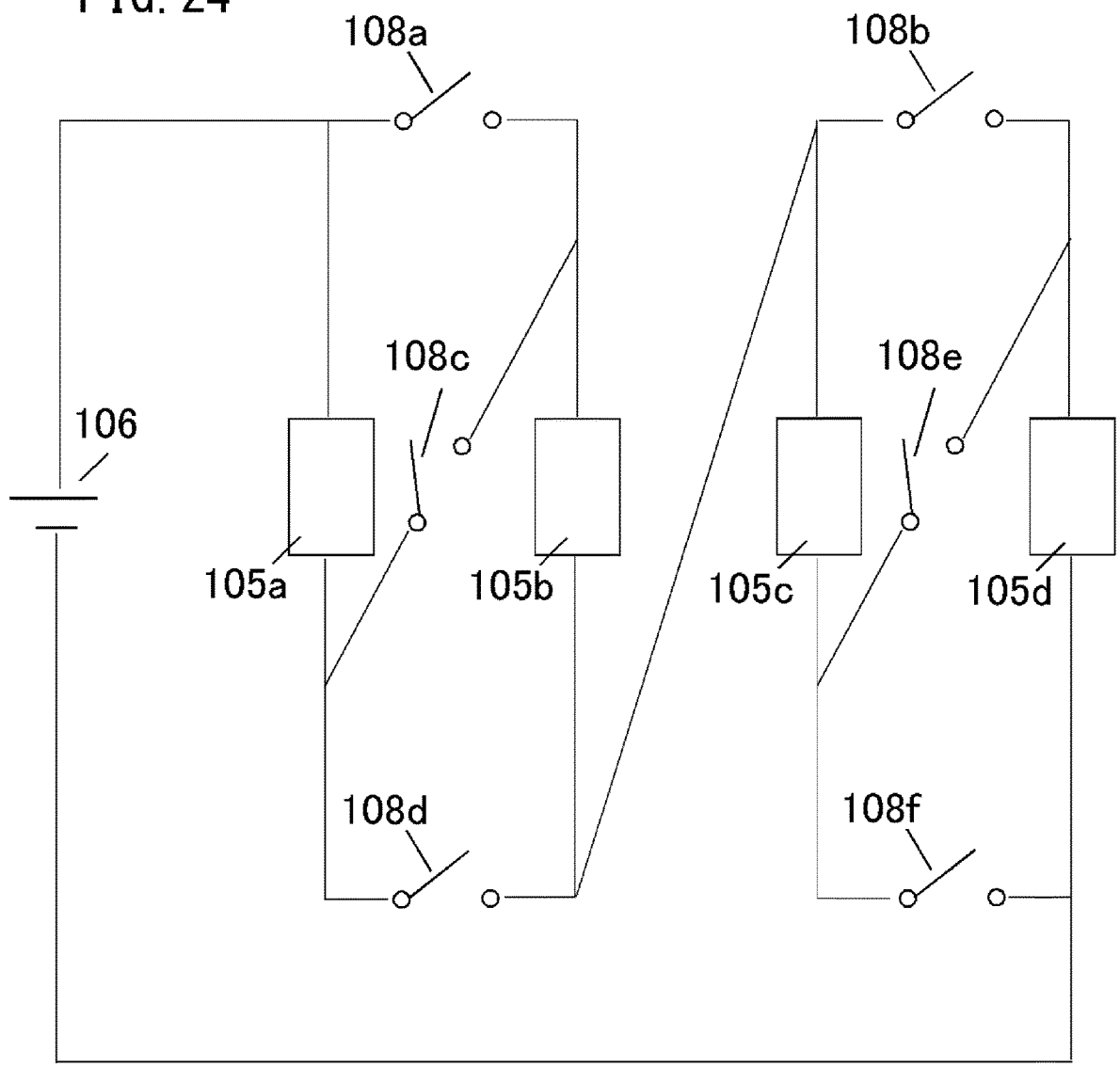
FIG. 24 is a diagram illustrating an equivalence circuit with focus on semiconductor elements in the oscillator according to Example 8.

Next, an oscillator according to Example 8 will be described with reference to FIGS. 22 to 24. FIG. 22 is a top view schematically illustrating an example of the oscillator according to Example 8, and FIG. 23 is a cross-sectional view taken along line L-L' in FIG. 22. FIG. 24 is an equivalence circuit of the oscillator according to Example 8, with focus just on the semiconductor elements 105 for the sake of brevity. In the oscillator according to the present Example, the oscillation structure 102a has the antenna 104a and the semiconductor elements 105a to 105d, and the antenna 104a and the semiconductor element 105a are electrically connected to each other. The conductor 113b is electrically connected to the semiconductor element 105b, the semiconductor element 105b and the semiconductor element 105c are electrically connected in series via the conductor 113c, and the conductor 113d is electrically connected to the semiconductor element 105d. The pads 112e to 112h are electrically connected to the substrate low-resistance layer 115, the pad 112e is electrically connected to the semiconductor element 105a via the substrate low-resistance layer 115, the pad 112f is electrically connected to the semiconductor element 105b via the substrate low-resistance layer 115, the pad 112g is electrically connected to the semiconductor element 105c via the substrate low-resistance layer 115, and the pad 112h is electrically connected to the semiconductor element 105d and the first insulator 109 via the substrate low-resistance layer 115. The power feed structure 103 has the power source 106, the bias supply unit 107, and the control units 108a to 108f, and the bias supply unit 107 has the wiring 111 including wire bonding, the pads 112a to 112h, and the conductors 113a to 113d. Upon turning the control units 108c and 108e to on, and the control units 108a, 108b, 108d, and 108f to off, the semiconductor elements 105a to 105d are electrically connected to each other in series. Upon turning the control units 108b, 108c, and 108f to on, and the control units 108a, 108d, and 108e to off, the semiconductor element 105a, the semiconductor element 105b, and the semiconductor elements 105c and 105d are electrically connected to each other in series. Upon turning the control units 108a, 108b, 108d, and 108f to on, and the control units 108c and 108e to off, the semiconductor elements 105a and 105b, and the semiconductor elements 105c and 105d are electrically connected to each other in series.

The oscillator 100 according to Example 8 is made up of $P_l$ piece(s) to $P_m$ piece(s) of the semiconductor elements that are connected to each other in series. $P_l$ (l=1 to m) satisfies Expression (16), in the same way as in Example 7. Also, the $P_l$ piece(s) of semiconductor elements are each made up of a single semiconductor element or single semiconductor elements that are connected to each other in parallel, and have negative resistance properties when being driven by the power feed structure 103. Also, the oscillator 100 according to Example 8 satisfies at least one of the following conditions (1) to (5).
(1) N changes by operations of control units
(2) m changes by operations of control units
(3) m changes to m' by operations of control units, and at least one of $P_l$ to $P_{m'}$ is a value that does not exist in the $P_l$ to $P_m$
(4) F changes by operations of control units
(5) R changes by operations of control units At this time, in the example illustrated in FIG. 22, bias is supplied in the forward direction to the oscillation structure 102a. In accordance with the following Table 3, the control unit 108a is then turned to off, the control unit 108b to off, the control unit 108c to on, the control unit 108d to off, the control unit 108e to on, and the control unit 108f to off. At this time, the oscillation structure 102a is an oscillation structure in a case in which N=4, S=4, $P_1$=1, $P_2$=1, $P_3$=1, $P_4$=1, F=4, and R=0. Also, the control unit 108a is turned to off, the control unit 108b to on, the control unit 108c to on, the control unit 108d to off, the control unit 108e to off, and the control unit 108f to on. At this time, the oscillation structure 102a is an oscillation structure in a case in which N=4, S=3, $P_1$=1, $P_2$=1, $P_3$=2, F=4, and R=0. Also, the control unit 108a is turned to on, the control unit 108b to on, the control unit 108c to off, the control unit 108d to on, the control unit 108e to off, and the control unit 108f to on. At this time, the oscillation structure 102a is an oscillation structure in a case in which N=4, S=2, $P_1$=2, $P_2$=2, F=4, and R=0. Note that in a case in which bias is supplied to the oscillation structure 102a in the reverse direction, the values of F and R are interchanged in each of the oscillation structures, and the values of N, S, and $P_I$ are the same values.

In the oscillator 100 according to Example 8, electromagnetic waves of three types of oscillation frequencies can be transmitted or received with a single oscillation structure. The capacitance $C_a$ of the antenna is set to 80 fF, and the capacitance $C_d$ of the semiconductor elements 105a to 105d is set to 15 fF. Also, the oscillation frequency of one of the semiconductor elements 105a to 105d making up the oscillation structure in a case of forward bias supply is 500 GHz. With the three types of oscillation frequencies respectively represented by $f_1$, $f_2$, and $f_3$, $f_1$=533 GHz, $f_2$=526 GHz, and $f_3$=500 GHz are obtained. From the equivalence circuit illustrated in FIG. 24, the correlation between the operations of the control units 108a to 108f and the oscillation frequencies $f_1$, $f_2$, and $f_3$ is as shown in Table 3.

TABLE 3

| CONTROL UNIT | $f_1$ | $f_2$ | $f_3$ |
| --- | --- | --- | --- |
| 108a | OFF | OFF | ON |
| 108b | OFF | ON | ON |
| 108c | ON | ON | OFF |
| 108d | OFF | OFF | ON |
| 108e | ON | OFF | OFF |
| 108f | OFF | ON | ON |

While the above is a description relating to the present embodiment, the configurations and processing of the oscillator described above are not limited to the above-described Examples, and various changes may be made without departing from the scope of sameness with the technical spirit of the present invention. For example, the above-described embodiment and Examples use a square patch antenna as the terahertz wave resonator. However, the shape of the resonator is not limited to this, and a resonator or the like of a structure using a patch conductor that is, for example, polygonal, such as rectangular, triangular, or the like, circular, elliptical, or the like, may be used. Also, the material of the RTD may be changed as appropriate.

Also, the oscillator described in the above-described embodiment and Examples can be applied to a detecting system, for example. A detecting system has a reception element that receives radio frequency waves from an oscillator and a processing circuit that processes signals received by the reception element. The detecting system may be a camera system that uses terahertz waves, for example.

Figure 27:
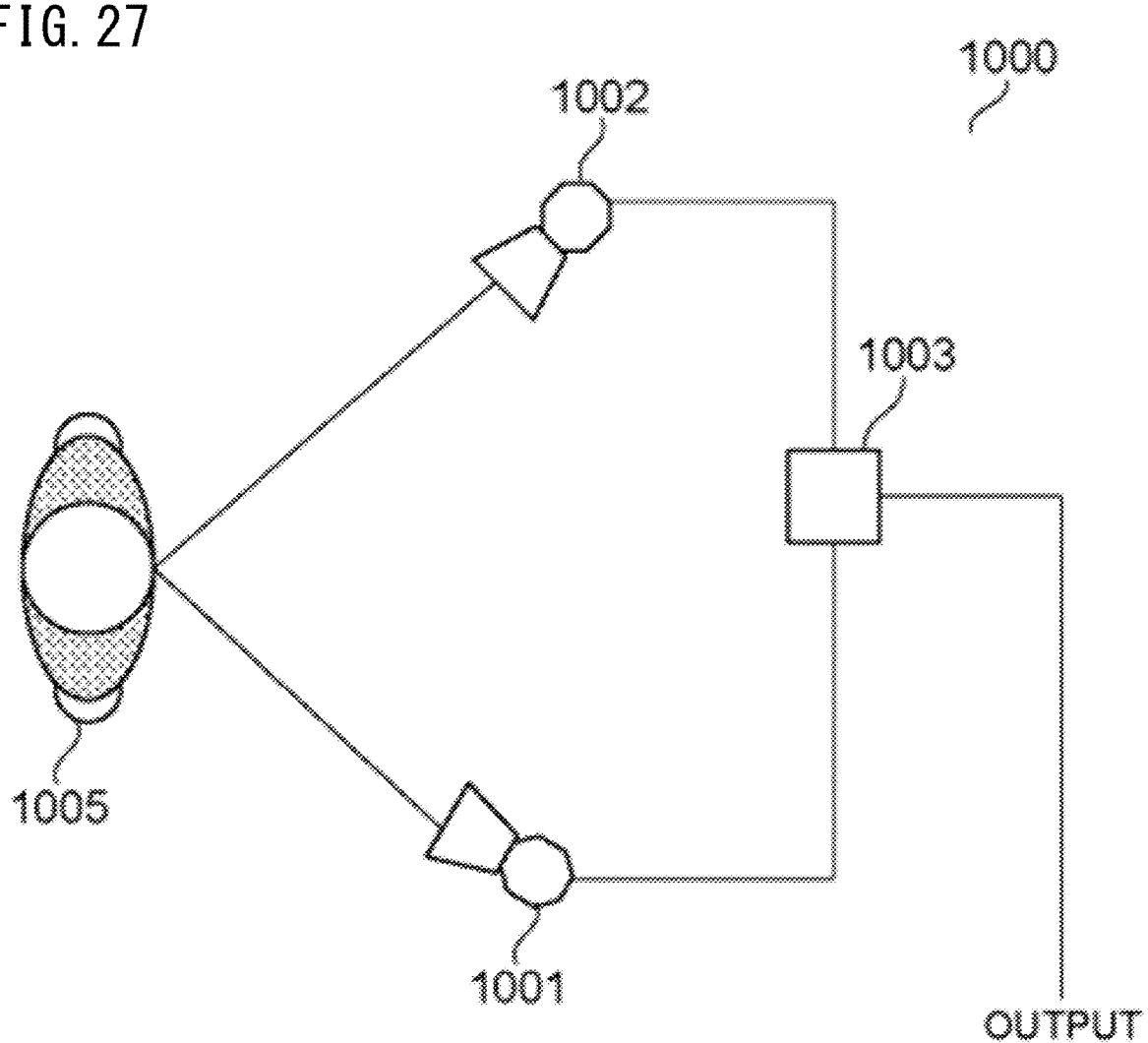
FIG. 27 is a diagram illustrating a camera system using the oscillator according to the embodiment.

A camera system will be described below as an application example, with reference to FIG. 27. A terahertz camera system 1000 has an emission unit 1001 that emits terahertz waves using the oscillator described in the above embodiment and Examples, and a reception unit 1002 that detects the terahertz waves. Further, the terahertz camera system 1000 has a control unit 1003 that controls the operations of the emission unit 1001 and the reception unit 1002 on the basis of external signals. The control unit 1003 has a processing circuit for processing signals received by the reception unit 1002, and processing or externally outputting images based on the detected terahertz waves. The oscillator according to the embodiment may be used in the emission unit 1001, or may be used in the reception unit 1002.

The terahertz waves from the emission unit 1001 are reflected by a subject 1005 and detected by the reception unit 1002. A camera system that has the emission unit 1001 and the reception unit 1002 is also referred to as an active-type camera system. Note that in a passive-type camera system that does not have the emission unit 1001, the oscillator according to the embodiment can be used in the reception unit. Images with high detection sensitivity and high image quality can be obtained by an electromagnetic wave camera system, by using an electromagnetic wave module according to the embodiment.

According to the technology of to the present disclosure, an oscillator with a higher degree of freedom in selectable oscillation frequencies with a single oscillator, without addition of new parts, can be provided.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-210623, filed on Dec. 24, 2021, which is hereby incorporated by reference herein in its entirety.

What is claimed is:

1. An oscillator, comprising:
a substrate;
a plurality of oscillation structures that transmit or receive electromagnetic waves and are arranged on the substrate; and
a power feed structure for electrically driving the plurality of oscillation structures, the power feed structure being arranged on the substrate, wherein
the power feed structure includes a power source and a bias supply unit that supplies bias to the plurality of oscillation structures,
the oscillation structures each include one antenna and an N piece (N≥1) of a semiconductor element electrically connected to the antenna,
the semiconductor elements exhibit negative resistance characteristics when driven by the power feed structure, and out of the N piece thereof, a P piece (P≥0) thereof are connected to each other in parallel, and an S piece (S≥0) thereof are connected to each other in series, and with a direction of current flowing perpendicularly upward as to the substrate as a forward direction, an F piece (F≥0) thereof are supplied with bias in the forward direction, and an R piece (R≥0) thereof are supplied with bias in a reverse direction,
the semiconductor element included in at least one of the oscillation structures exhibits asymmetrical current-voltage properties as to each other between forward bias and reverse bias, and
at least one of the N, P, S, F, and R differs from another among the oscillation structures that are different from one another.

2. An oscillator, comprising:
a substrate;
a plurality of oscillation structures that transmit or receive electromagnetic waves, and are arranged on the substrate; and
a power feed structure for electrically driving the plurality of oscillation structures, the power feed structure being arranged on the substrate, wherein
the power feed structure includes a power source, a bias supply unit that supplies bias to the plurality of oscillation structures, and a control unit that controls the bias supply by the bias supply unit,
the oscillation structures each include one antenna and an N piece (N≥1) of a semiconductor element electrically connected to the antenna,
the N piece of semiconductor elements are supplied with bias by operations of the control unit and exhibit negative resistance characteristics, and out of the N piece thereof, a P piece (P≥0) thereof are supplied with bias by operations of the control unit and are connected to each other in parallel, and an S piece (S≥0) thereof are supplied with bias by operations of the control unit and are connected to each other in series, and with a direction of current flowing perpendicularly upward as to the substrate as a forward direction, an F piece (F≥0) thereof are supplied with bias in the forward direction by operations of the control unit, and an R piece (R≥0) thereof are supplied with bias in a reverse direction by operations of the control unit,
the semiconductor element included in at least one of the oscillation structures exhibits asymmetrical current-voltage properties as to each other between forward bias and reverse bias, and
at least one of the N, P, S, F, and R differs from another among the oscillation structures that are different from one another, by operations of the control unit.

3. An oscillator, comprising:
a substrate;
one oscillation structure that transmits or receives electromagnetic waves, and is arranged on the substrate; and
a power feed structure for electrically driving the oscillation structure, the power feed structure being arranged on the substrate, wherein
the power feed structure includes a power source, a bias supply unit that supplies bias to the oscillation structure, and a control unit that controls the bias supply by the bias supply unit,
the oscillation structure includes one antenna and an N piece (N≥2) of a semiconductor element electrically connected to the antenna,
the N piece of semiconductor elements are supplied with bias by operations of the control unit and exhibit negative resistance characteristics, and out of the N piece thereof, a P piece (P≥0) thereof are supplied with bias by operations of the control unit and are connected to each other in parallel, and an S piece (S≥0) thereof are supplied with bias by operations of the control unit and are connected to each other in series, and with a direction of current flowing perpendicularly upward as to the substrate as a forward direction, an F piece (F≥0) thereof are supplied with bias in the forward direction by operations of the control unit, and an R piece (R≥0) thereof are supplied with bias in a reverse direction by operations of the control unit,
the semiconductor elements exhibit asymmetrical current-voltage properties as to each other between forward bias and reverse bias, and
at least one of the N, P, S, F, and R changes, by operations of the control unit.

4. The oscillator according to claim 1, wherein
the N is N≥2,
the oscillator is made up of an $S_1$ piece to an $S_n$ piece of the semiconductor elements that are connected to each other in parallel, and $S_k$ (k=1 to n) satisfies the following Expression (1), $$\sum_{k=1}^{n} S_k = N, n \geq 2, S_k \geq 1 \tag{1}$$

the $S_k$ piece (k=1 to n) of semiconductor elements are each made up of a single semiconductor element or single semiconductor elements that are connected to each other in series, and have negative resistance properties when being driven by the power feed structure, and
at least one of the following conditions (1) to (5)
(1) the N is different among different oscillation structures,
(2) the n is different among different oscillation structures,
(3) at least one of the $S_1$ to $S_n$ of one oscillation structure is a value that does not exist in another oscillation structure,
(4) the F is different among different oscillation structures, and
(5) the R is different among different oscillation structures,
is satisfied.

5. The oscillator according to claim 2, wherein
the N is N≥2,
the oscillator is made up of an $S_1$ piece to an $S_n$ piece of the semiconductor elements that are connected to each other in parallel, and $S_k$ (k=1 to n) satisfies the following Expression (1), $$\sum_{k=1}^{n} S_k = N, n \geq 2, S_k \geq 1 \tag{1}$$

the $S_k$ piece (k=1 to n) of semiconductor elements are each made up of a single semiconductor element or single semiconductor elements that are connected to each other in series, and have negative resistance properties when being driven by the power feed structure, and
at least one of the following conditions (1) to (5)
(1) the N is different among different oscillation structures,
(2) the n is different among different oscillation structures,
(3) at least one of the $S_1$ to $S_n$ of one oscillation structure is a value that does not exist in another oscillation structure,
(4) the F is different among different oscillation structures, and
(5) the R is different among different oscillation structures,
is satisfied.

6. The oscillator according to claim 2, wherein
the N is N≥2,
the oscillator is made up of an $S_1$ piece to an $S_n$ piece of the semiconductor elements that are connected to each other in parallel, and $S_k$ (k=1 to n) satisfies the following Expression (2), $$\sum_{k=1}^{n} S_k = N, n \geq 2, S_k \geq 1 \quad (2)$$

the $S_k$ piece (k=1 to n) of semiconductor elements are each made up of a single semiconductor element or single semiconductor elements that are connected to each other in series, and have negative resistance properties when being driven by the power feed structure, and
at least one of the following conditions (1) to (5)
  (1) the N changes by operations of the control unit,
  (2) the n changes by operations of the control unit,
  (3) the n changes to n' by operations of the control unit, and at least one of the $S_1$ to $S_{n'}$ is a value that does not exist in the $S_1$ to $S_n$
  (4) the F changes by operations of the control unit, and
  (5) the R changes by operations of the control unit,
is satisfied.

7. The oscillator according to claim 3, wherein
the N is N≥2,
the oscillator is made up of an $S_1$ piece to an $S_n$ piece of the semiconductor elements that are connected to each other in parallel, and $S_k$ (k=1 to n) satisfies the following Expression (2), $$\sum_{k=1}^{n} S_k = N, n \geq 2, S_k \geq 1 \quad (2)$$

the $S_k$ piece (k=1 to n) of semiconductor elements are each made up of a single semiconductor element or single semiconductor elements that are connected to each other in series, and have negative resistance properties when being driven by the power feed structure, and
at least one of the following conditions (1) to (5)
  (1) the N changes by operations of the control unit,
  (2) the n changes by operations of the control unit,
  (3) the n changes to n' by operations of the control unit, and at least one of the $S_1$ to $S_{n'}$ is a value that does not exist in the $S_1$ to $S_n$
  (4) the F changes by operations of the control unit, and
  (5) the R changes by operations of the control unit,
is satisfied.

8. The oscillator according to claim 1, wherein
the N is N≥2,
the oscillator is made up of a $P_1$ piece to a $P_m$ piece of the semiconductor elements that are connected to each other in series, and $P_l$ (l=1 to m) satisfies the following Expression (3), $$\sum_{l=1}^{m} P_l = N, m \geq 2, P_l \geq 1 \quad (3)$$

the $P_l$ piece (l=1 to m) of semiconductor elements are each made up of a single semiconductor element or single semiconductor elements that are connected to each other in parallel, and have negative resistance properties when being driven by the power feed structure, and
at least one of the following conditions (1) to (5)
  (1) the N is different among different oscillation structures,
  (2) the m is different among different oscillation structures,
  (3) at least one of the $P_l$ to $P_m$ of one oscillation structure is a value that does not exist in another oscillation structure,
  (4) the F is different among different oscillation structures, and
  (5) the R is different among different oscillation structures,
is satisfied.

9. The oscillator according to claim 2, wherein
the N is N≥2,
the oscillator is made up of a $P_l$ piece to a $P_m$ piece of the semiconductor elements that are connected to each other in series, and $P_l$ (l=1 to m) satisfies the following Expression (3), $$\sum_{l=1}^{m} P_l = N, m \geq 2, P_l \geq 1 \quad (3)$$

the $P_l$ piece (l=1 to m) of semiconductor elements are each made up of a single semiconductor element or single semiconductor elements that are connected to each other in parallel, and have negative resistance properties when being driven by the power feed structure, and
at least one of the following conditions (1) to (5)
  (1) the N is different among different oscillation structures,
  (2) the m is different among different oscillation structures,
  (3) at least one of the $P_l$ to $P_m$ of one oscillation structure is a value that does not exist in another oscillation structure,
  (4) the F is different among different oscillation structures, and
  (5) the R is different among different oscillation structures,
is satisfied.

10. The oscillator according to claim 2, wherein
the N is N≥2,
the oscillator is made up of a $P_l$ piece to a $P_m$ piece of the semiconductor elements that are connected to each other in series, and $P_l$ (l=1 to m) satisfies the following Expression (4), $$\sum_{l=1}^{m} P_l = N, m \geq 2, P_l \geq 1 \quad (4)$$

the $P_l$ piece (l=1 to m) of semiconductor elements are each made up of a single semiconductor element or single semiconductor elements that are connected to each other in parallel, and have negative resistance properties when being driven by the power feed structure, and
at least one of the following conditions (1) to (5)
   (1) the N changes by operations of the control unit,
   (2) the m changes by operations of the control unit,
   (3) the m changes to m' by operations of the control unit, and at least one of the $P_1$ to $P_{m'}$ is a value that does not exist in the $P_l$ to $P_m$
   (4) the F changes by operations of the control unit, and
   (5) the R changes by operations of the control unit,
is satisfied.

11. The oscillator according to claim 3, wherein
the N is N≥2,
the oscillator is made up of a $P_l$ piece to a $P_m$ piece of the semiconductor elements that are connected to each other in series, and $P_l$ (l=1 to m) satisfies the following Expression (4), $$\sum_{l=1}^{m} P_l = N, m \geq 2, P_l \geq 1 \qquad (4)$$

the $P_l$ piece (l=1 to m) of semiconductor elements are each made up of a single semiconductor element or single semiconductor elements that are connected to each other in parallel, and have negative resistance properties when being driven by the power feed structure, and
at least one of the following conditions (1) to (5)
   (1) the N changes by operations of the control unit,
   (2) the m changes by operations of the control unit,
   (3) the m changes to m' by operations of the control unit, and at least one of the $P_l$ to $P_{m'}$ is a value that does not exist in the $P_l$ to $P_m$
   (4) the F changes by operations of the control unit, and
   (5) the R changes by operations of the control unit,
is satisfied.

12. The oscillator according to claim 4, wherein
the semiconductor elements exhibit negative resistance characteristics only in a range of driving voltage $V_{min}$ to $V_{max}$ ($V_{min}>0$ and $V_{max}>0$) when the direction of bias supply is forward, and in a range of driving voltage $-V_{min'}$ to $-V_{max'}$ ($V_{min'}<0$ and $V_{max'}<0$) when the direction of bias supply is reverse,
the $S_k$ piece of semiconductor elements and a $C_k$ piece ($C_k \geq 0$) of semiconductor elements are connected to each other
the $C_k$ piece of semiconductor elements are each made up of single semiconductor elements connected to each other in series in $C_k \geq 2$, and the $C_k$ piece of semiconductor elements exhibit positive resistance characteristics when driven by the power feed structure,
the $S_k$ piece (k=1 to n) of semiconductor elements are each made up of a single semiconductor element or semiconductor elements $E_{ik}$ (i=1 to $S_k$) connected to each other in series, and with $A_{ik}$ representing a cross-sectional area of the semiconductor elements $E_{ik}$ on a cross-section taken along a plane parallel to the substrate, the following Expression (5) is satisfied with respect to any k and any i, i' (i≠i', 1≤i, and i'≤$S_k$),
the $C_k$ piece (k=1 to n) of semiconductor elements are each made up of a single semiconductor element or semiconductor elements $F_{ik}$ (i=1 to $C_k$) connected to each other in series, and with $B_{ik}$ representing a cross-sectional area of the semiconductor elements $F_{ik}$ on a cross-section taken along a plane parallel to the substrate, voltages $V_{in}$, $V_{min}$ and $V_{max}$, and $V_{min'}$ and $V_{max'}$, which are applied to the $S_k$ piece (k=1 to n) of the semiconductor elements satisfy the following Expressions (6) to (9), with respect to any k, k' (k≠k', 1≤k, and k'≤n)

$$A_{ik} = A_{i'k} \overset{\text{ter}}{=} A_k \qquad (5)$$

$$\frac{V_{min}}{V_{in}} \leq \frac{\dfrac{1}{A_k}}{\dfrac{S_k}{A_k} + \sum_{i=1}^{C_k} \dfrac{1}{B_{ik}}} = \frac{\dfrac{1}{A_{k'}}}{\dfrac{S_{k'}}{A_{k'}} + \sum_{i=1}^{C_{k'}} \dfrac{1}{B_{ik'}}} \leq \frac{V_{max}}{V_{in}}(V_{in}>0) \qquad (6)$$

$$\frac{-V'_{min}}{V_{in}} \leq \frac{\dfrac{1}{A_k}}{\dfrac{S_k}{A_k} + \sum_{i=1}^{C_k} \dfrac{1}{B_{ik}}} = \frac{\dfrac{1}{A_{k'}}}{\dfrac{S_{k'}}{A_{k'}} + \sum_{i=1}^{C_{k'}} \dfrac{1}{B_{ik'}}} \leq \frac{-V'_{max}}{V_{in}}(V_{in}<0) \qquad (7)$$

$$0 < \frac{\dfrac{1}{B_{ik}}}{\dfrac{S_k}{A_k} + \sum_{i=1}^{C_k} \dfrac{1}{B_{ik}}} < \frac{V_{min}}{V_{in}} \text{ OR } \frac{\dfrac{1}{B_{ik}}}{\dfrac{S_k}{A_k} + \sum_{i=1}^{C_k} \dfrac{1}{B_{ik}}} > \frac{V_{max}}{V_{in}}(V_{in}>0) \qquad (8)$$

or $$0 < \frac{\dfrac{1}{B_{ik}}}{\dfrac{S_k}{A_k} + \sum_{i=1}^{C_k} \dfrac{1}{B_{ik}}} < \frac{-V'_{min}}{V_{in}} \text{ OR } \frac{\dfrac{1}{B_{ik}}}{\dfrac{S_k}{A_k} + \sum_{i=1}^{C_k} \dfrac{1}{B_{ik}}} > \frac{-V'_{max}}{V_{in}}(V_{in}<0). \qquad (9)$$

13. The oscillator according to claim 6, wherein
the semiconductor elements exhibit negative resistance characteristics only in a range of driving voltage $V_{min}$ to $V_{max}$ ($V_{min}>0$ and $V_{max}>0$) when the direction of bias supply is forward, and in a range of driving voltage $-V_{min'}$ to $-V_{max'}$ ($V_{min'}<0$ and $V_{max'}<0$) when the direction of bias supply is reverse,
the $S_k$ piece of semiconductor elements and a $C_k$ piece ($C_k \geq 0$) of semiconductor elements are connected to each other
the $C_k$ piece of semiconductor elements are each made up of single semiconductor elements connected to each other in series in $C_k \geq 2$, and the $C_k$ piece of semiconductor elements exhibit positive resistance characteristics when driven by the power feed structure,
the $S_k$ piece (k=1 to n) of semiconductor elements are made up of a single semiconductor element or semiconductor elements $E_{ik}$ (i=1 to $S_k$) connected to each other in series, and with $A_{ik}$ representing a cross-sectional area of the semiconductor elements $E_{ik}$ on a cross-section taken along a plane parallel to the substrate, the following Expression (5) is satisfied with respect to any k and any i, i' (i≠i', 1≤i, and i'≤$S_k$),
the $C_k$ piece (k=1 to n) of semiconductor elements are each made up of a single semiconductor element or semiconductor elements $F_{ik}$ (i=1 to $C_k$) connected to each other in series, and with $B_{ik}$ representing a cross-sectional area of the semiconductor elements $F_{ik}$ on a cross-section taken along a plane parallel to the substrate, voltages $V_{in}$, $V_{min}$ and $V_{max}$, and $V_{min'}$ and $V_{max'}$, which are applied to the $S_k$ piece (k=1 to n) of the semiconductor elements satisfy the following Expressions (6) to (9), with respect to any k, k' (k≠k', 1≤k, and k'≤n)

$$A_{ik} = A_{i'k} \overset{\text{ter}}{=} A_k \qquad (5)$$

$$\frac{V_{min}}{V_{in}} \leq \frac{\frac{1}{A_k}}{\frac{S_k}{A_k} + \sum_{i=1}^{C_k} \frac{1}{B_{ik}}} = \frac{\frac{1}{A_{k'}}}{\frac{S_{k'}}{A_{k'}} + \sum_{i=1}^{C_{k'}} \frac{1}{B_{ik'}}} \leq \frac{V_{max}}{V_{in}}(V_{in} > 0) \quad (6)$$

$$\frac{-V'_{min}}{V_{in}} \leq \frac{\frac{1}{A_k}}{\frac{S_k}{A_k} + \sum_{i=1}^{C_k} \frac{1}{B_{ik}}} = \frac{\frac{1}{A_{k'}}}{\frac{S_{k'}}{A_{k'}} + \sum_{i=1}^{C_{k'}} \frac{1}{B_{ik'}}} \leq \frac{-V'_{max}}{V_{in}}(V_{in} < 0) \quad (7)$$

$$0 < \frac{\frac{1}{B_{ik}}}{\frac{S_k}{A_k} + \sum_{i=1}^{C_k} \frac{1}{B_{ik}}} < \frac{V_{min}}{V_{in}} \text{ OR } \frac{\frac{1}{B_{ik}}}{\frac{S_k}{A_k} + \sum_{i=1}^{C_k} \frac{1}{B_{ik}}} > \frac{V_{max}}{V_{in}}(V_{in} > 0) \quad (8)$$

or $$0 < \frac{\frac{1}{B_{ik}}}{\frac{S_k}{A_k} + \sum_{i=1}^{C_k} \frac{1}{B_{ik}}} < \frac{-V'_{min}}{V_{in}} \text{ OR } \frac{\frac{1}{B_{ik}}}{\frac{S_k}{A_k} + \sum_{i=1}^{C_k} \frac{1}{B_{ik}}} > \frac{-V'_{max}}{V_{in}}(V_{in} < 0). \quad (9)$$

14. The oscillator according to claim 8, wherein
the semiconductor elements exhibit negative resistance characteristics only in a range of driving voltage $V_{min}$ to $V_{max}$ ($V_{min}>0$ and $V_{max}>0$) when the direction of bias supply is forward, and in a range of driving voltage $-V'_{min}$ to $-V'_{max}$ ($V_{min'}<0$ and $V_{max'}<0$) when the direction of bias supply is reverse, the $P_l$ piece (l=1 to m) of semiconductor elements are each made up of a single semiconductor element or semiconductor elements $E_{jl}$ (j=1 to $P_l$) connected to each other in parallel, and with $A_{jl}$ representing a cross-sectional area of the semiconductor elements $E_{jl}$ on a cross-section taken along a plane parallel to the substrate, cross-sectional areas $A_{jl}$ and $A_{jl'}$ of the semiconductor elements, and voltages $V_{in}$, $V_{min}$ and $V_{max}$, and $V_{min'}$ and $V_{max'}$, which are applied to the $P_m$ piece of the semiconductor elements connected to each other in series, satisfy the following Expressions (10) and (11), with respect to any l, l' (l≠l', 1≤l, and l'≤m), and j (j=1 to Pl)

$$\frac{V_{min}}{V_{in}} \leq \frac{1}{\left(\sum_{j=1}^{Pl} A_{jl}\right)\left(\sum_{l=1}^{m} \frac{1}{\sum_{j=1}^{P_l} A_{jl}}\right)} = \quad (10)$$

$$\frac{1}{\left(\sum_{j=1}^{Pl} A_{jl'}\right)\left(\sum_{l=1}^{m} \frac{1}{\sum_{j=1}^{P_l} A_{jl}}\right)} \leq \frac{V_{max}}{V_{in}}(V_{in} > 0)$$

$$\frac{-V'_{min}}{V_{in}} \leq \frac{1}{\left(\sum_{j=1}^{Pl} A_{jl}\right)\left(\sum_{l=1}^{m} \frac{1}{\sum_{j=1}^{P_l} A_{jl}}\right)} = \quad (11)$$

$$\frac{1}{\left(\sum_{j=1}^{Pl} A_{jl'}\right)\left(\sum_{l=1}^{m} \frac{1}{\sum_{j=1}^{P_l} A_{jl}}\right)} \leq \frac{-V'_{max}}{V_{in}}(V_{in} < 0).$$

15. The oscillator according to claim 10, wherein
the semiconductor elements exhibit negative resistance characteristics only in a range of driving voltage $V_{min}$ to $V_{max}$ ($V_{min}>0$ and $V_{max}>0$) when the direction of bias supply is forward, and in a range of driving voltage $-V'_{min}$ to $-V'_{max}$ ($V_{min'}<0$ and $V_{max'}<0$) when the direction of bias supply is reverse, the $P_l$ piece (l=1 to m) of semiconductor elements are each made up of a single semiconductor element or semiconductor elements $E_{jl}$ (j=1 to $P_l$) connected to each other in parallel, and with $A_{jl}$ representing a cross-sectional area of the semiconductor elements $E_{jl}$ on a cross-section taken along a plane parallel to the substrate, cross-sectional areas $A_{jl}$ and $A_{jl'}$ of the semiconductor elements, and voltages $V_{in}$, $V_{min}$ and $V_{max}$, and $V_{min'}$ and $V_{max'}$, which are applied to the $P_m$ piece of the semiconductor elements connected to each other in series, satisfy the following Expressions (10) and (11), with respect to any l, l' (l≠l', 1≤l, and l'≤m), and j (j=1 to Pl)

$$\frac{V_{min}}{V_{in}} \leq \frac{1}{\left(\sum_{j=1}^{Pl} A_{jl}\right)\left(\sum_{l=1}^{m} \frac{1}{\sum_{j=1}^{P_l} A_{jl}}\right)} = \quad (10)$$

$$\frac{1}{\left(\sum_{j=1}^{Pl} A_{jl'}\right)\left(\sum_{l=1}^{m} \frac{1}{\sum_{j=1}^{P_l} A_{jl}}\right)} \leq \frac{V_{max}}{V_{in}}(V_{in} > 0)$$

$$\frac{-V'_{min}}{V_{in}} \leq \frac{1}{\left(\sum_{j=1}^{Pl} A_{jl}\right)\left(\sum_{l=1}^{m} \frac{1}{\sum_{j=1}^{P_l} A_{jl}}\right)} = \quad (11)$$

$$\frac{1}{\left(\sum_{j=1}^{Pl} A_{jl'}\right)\left(\sum_{l=1}^{m} \frac{1}{\sum_{j=1}^{P_l} A_{jl}}\right)} \leq \frac{-V'_{max}}{V_{in}}(V_{in} < 0).$$

16. The oscillator according to claim 1, wherein the power feed structure drives the plurality of oscillation structures simultaneously.

17. The oscillator according to claim 2, wherein the power feed structure drives the plurality of oscillation structures simultaneously.

18. The oscillator according to claim 2, wherein, in the power feed structure the plurality of oscillation structures are driven individually, by operations of the control unit.

19. The oscillator according to claim 3, wherein, in the power feed structure a plurality of the oscillation structures are driven individually, by operations of the control unit.

20. The oscillator according to claim 2, wherein, in the power feed structure, individual driving of the plurality of oscillation structures by operations of the control unit and simultaneous driving of the plurality of oscillation structures is selectable.

21. The oscillator according to claim 2, wherein, in the power feed structure, part of the bias supply unit is insulated by operations of the control unit.

22. The oscillator according to claim 3, wherein, in the power feed structure, part of the bias supply unit is insulated by operations of the control unit.

23. The oscillator according to claim 2, wherein, in the power feed structure, a power source to be connected to the semiconductor elements or the oscillation structure is switched by operations of the control unit.

24. The oscillator according to claim 3, wherein, in the power feed structure, a power source to be connected to the semiconductor elements or the oscillation structure is switched by operations of the control unit.

25. The oscillator according to claim 1, wherein the antenna is a patch antenna.

26. The oscillator according to claim 2, wherein the antenna is a patch antenna.

27. The oscillator according to claim 3, wherein the antenna is a patch antenna.

28. The oscillator according to claim 1, wherein the electromagnetic waves include a frequency component from 30 GHz to 30 THz.

29. The oscillator according to claim 2, wherein the electromagnetic waves include a frequency component from 30 GHz to 30 THz.

30. The oscillator according to claim 3, wherein the electromagnetic waves include a frequency component from 30 GHz to 30 THz.

31. The oscillator according to claim 1, wherein the semiconductor element is a resonant tunneling diode.

32. The oscillator according to claim 2, wherein the semiconductor element is a resonant tunneling diode.

33. The oscillator according to claim 3, wherein the semiconductor element is a resonant tunneling diode.

34. A detecting system, comprising:
the oscillator according to claim 1;
a reception element that receives radio frequency waves from the oscillator; and
a processing circuit that processes signals from the reception element.

35. A detecting system, comprising:
the oscillator according to claim 2;
a reception element that receives radio frequency waves from the oscillator; and
a processing circuit that processes signals from the reception element.

36. A detecting system, comprising:
the oscillator according to claim 3;
a reception element that receives radio frequency waves from the oscillator; and
a processing circuit that processes signals from the reception element.

* * * * *